United States Patent
Ko et al.

(10) Patent No.: US 10,937,513 B2
(45) Date of Patent: Mar. 2, 2021

(54) SEMICONDUCTOR MEMORY DEVICE AND OPERATING METHOD THEREOF

(71) Applicant: SK hynix Inc., Icheon-si (KR)

(72) Inventors: Jung Mi Ko, Icheon-si (KR); Kwang Ho Baek, Icheon-si (KR); Ji Hwan Kim, Seoul (KR); Seong Je Park, Suwon-si (KR); Sung Hoon Ahn, Seoul (KR); Young Don Jung, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/667,760

(22) Filed: Oct. 29, 2019

(65) Prior Publication Data

US 2020/0202963 A1    Jun. 25, 2020

(30) Foreign Application Priority Data

Dec. 24, 2018 (KR) ............ 10-2018-0168700

(51) Int. Cl.
| | |
|---|---|
| *G11C 16/34* | (2006.01) |
| *H01L 27/11556* | (2017.01) |
| *H01L 27/11582* | (2017.01) |
| *G11C 16/10* | (2006.01) |
| *G11C 16/04* | (2006.01) |
| *G11C 11/56* | (2006.01) |

(52) U.S. Cl.
CPC .......... *G11C 16/3436* (2013.01); *G11C 16/04* (2013.01); *G11C 16/10* (2013.01); *H01L 27/11556* (2013.01); *H01L 27/11582* (2013.01); *G11C 11/5628* (2013.01); *G11C 11/5671* (2013.01)

(58) Field of Classification Search
CPC ..... G11C 16/3436; G11C 16/10; G11C 16/04; G11C 11/5628; G11C 11/5671; G11C 2211/5621; G11C 16/08; G11C 16/26; G11C 11/5642; G11C 16/3459; G11C 16/3427; H01L 27/11556; H01L 27/11582
USPC ................................................ 365/185.11
See application file for complete search history.

(56) References Cited

U.S. PATENT DOCUMENTS

2016/0180956 A1*  6/2016  Cho ................. G11C 16/34
                                                            365/185.21

FOREIGN PATENT DOCUMENTS

| KR | 1020080069393 A | 7/2008 |
|---|---|---|
| KR | 1020080095074 A | 10/2008 |
| KR | 1020090000370 A | 1/2009 |
| KR | 1020170091925 A | 8/2017 |
| KR | 1020170116068 A | 10/2017 |

* cited by examiner

*Primary Examiner* — Fernando Hidalgo
(74) *Attorney, Agent, or Firm* — William Park & Associates Ltd.

(57) ABSTRACT

A semiconductor memory device operates by applying a program pulse to a selected word line, updating a program pulse count value, determining a current sensing mode based upon the program pulse count value, and performing a program verify operation based upon the current sensing mode. The current sensing mode is determined by determining one of an individual state current sensing operation for determining verify pass or fail for one target program state and an all-state current sensing operation for determining verify pass or fail for all target program states.

15 Claims, 27 Drawing Sheets

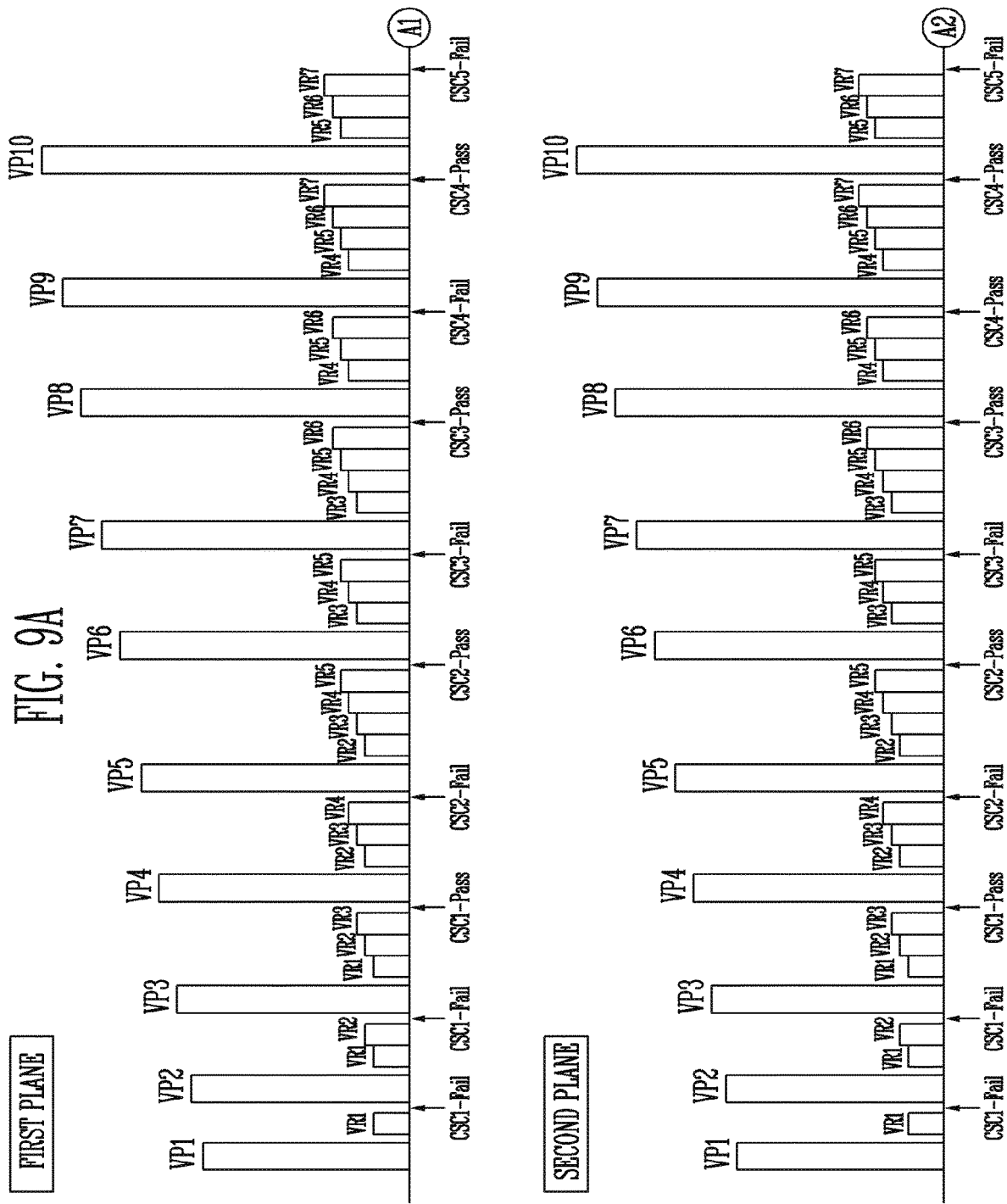

FIG. 9B
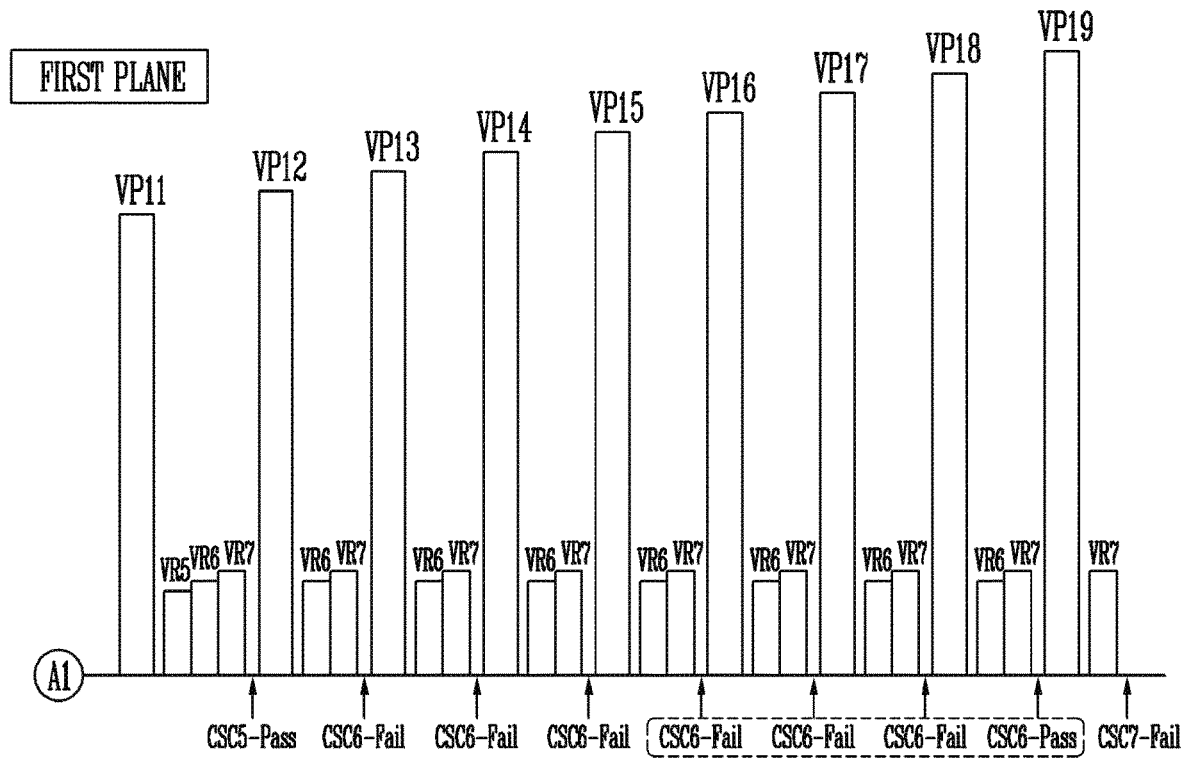
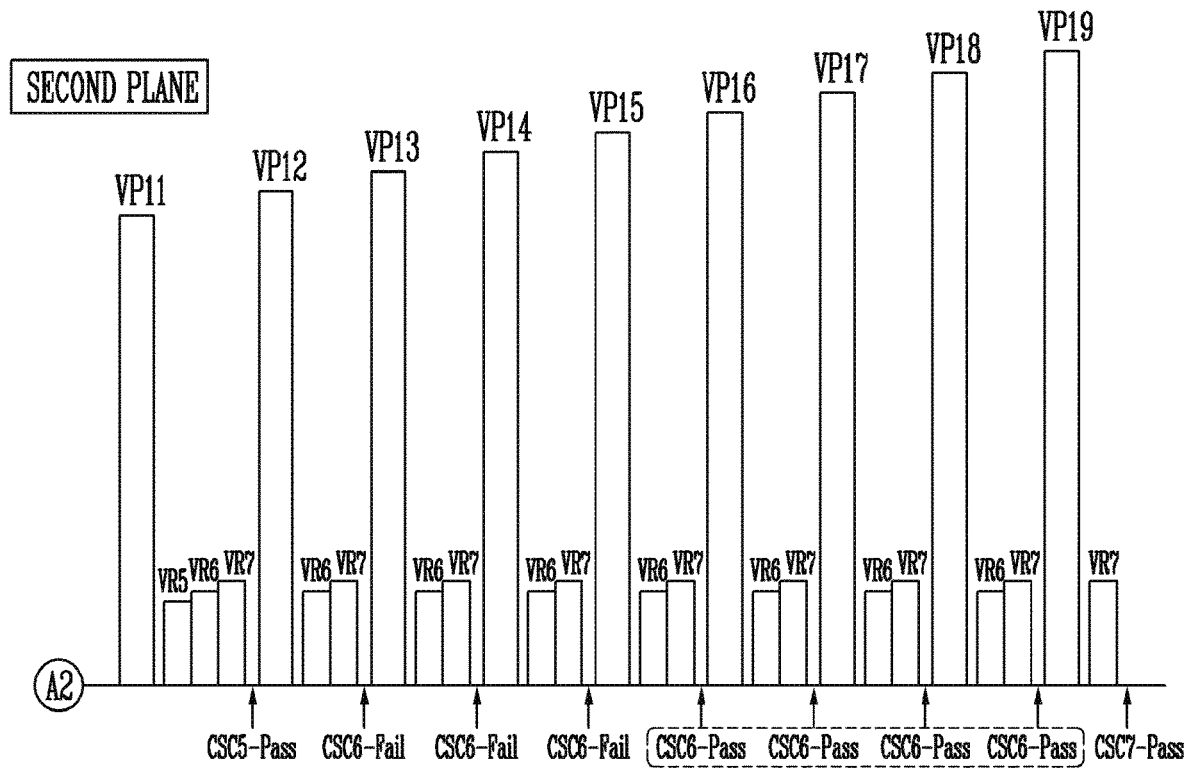

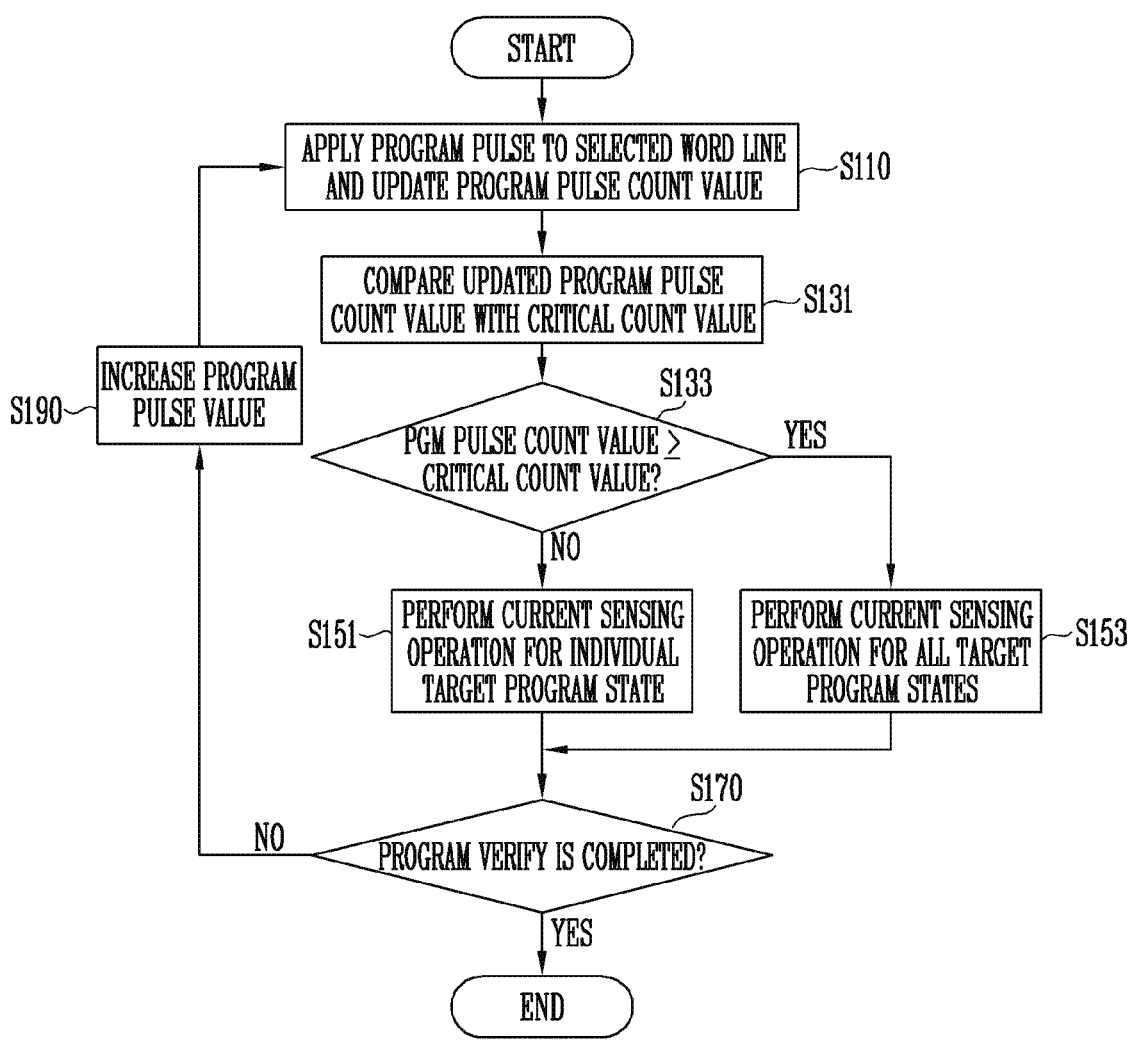

FIG. 13B
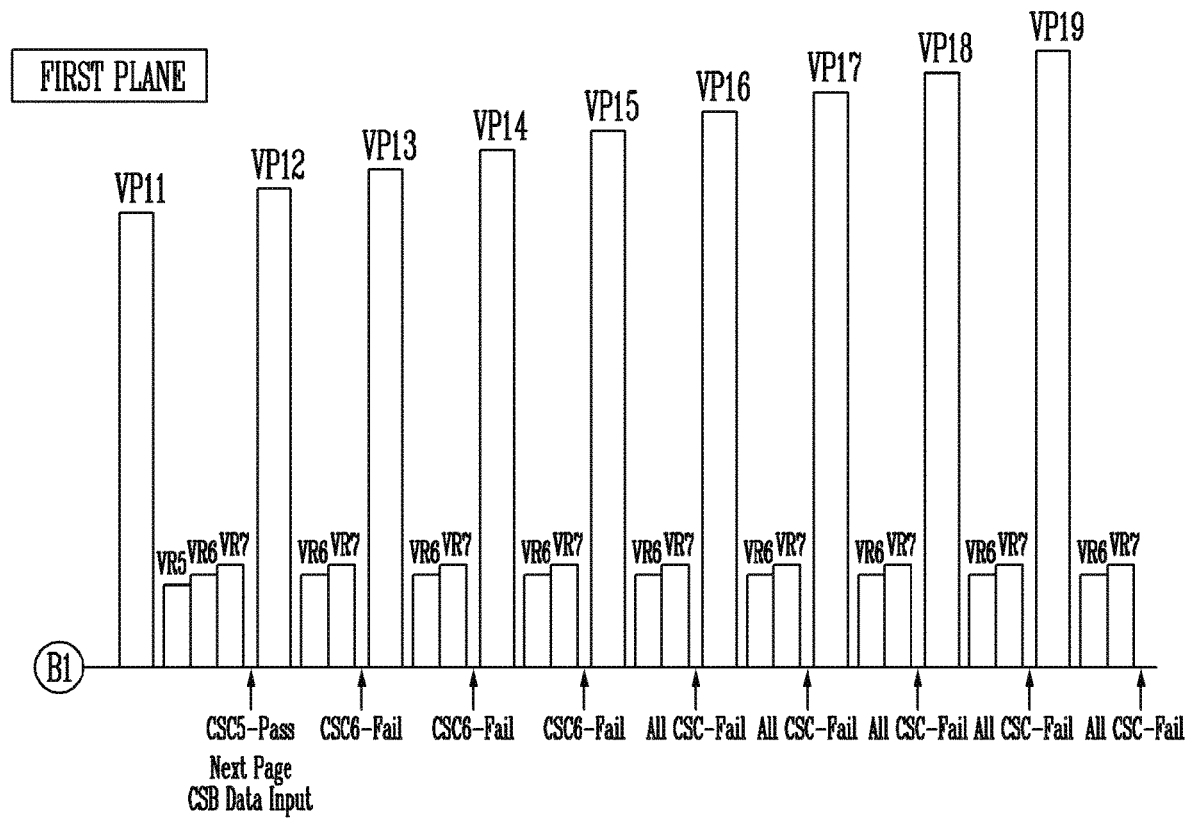
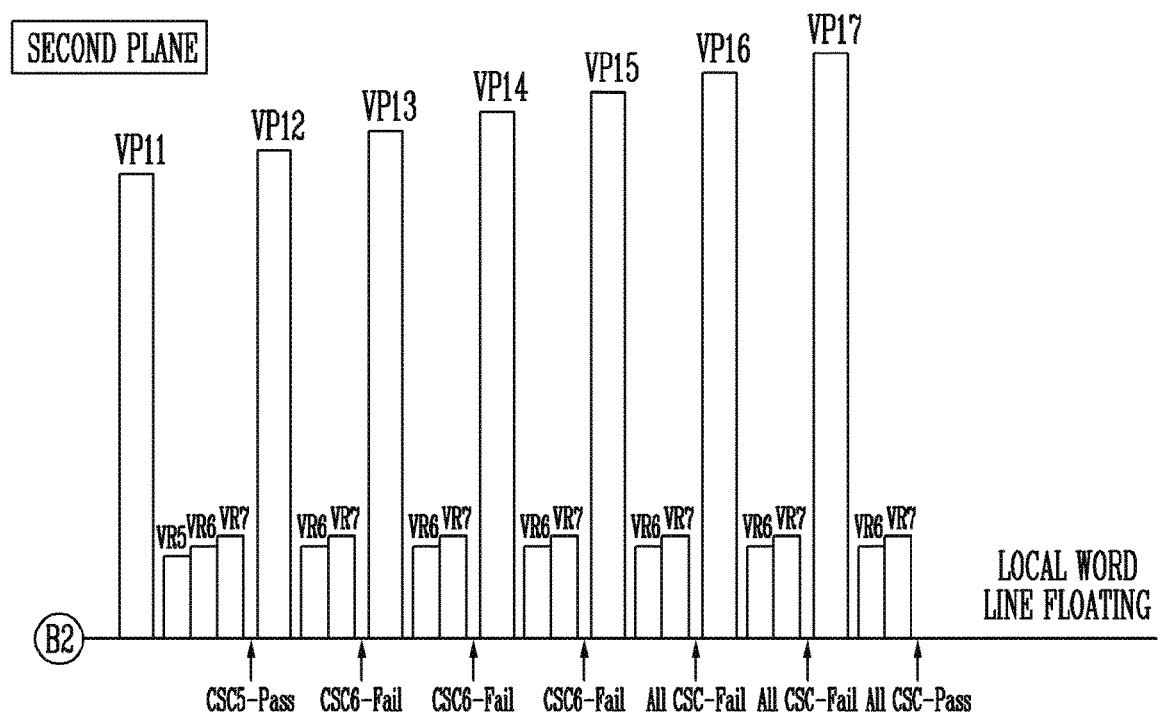

FIG. 16B
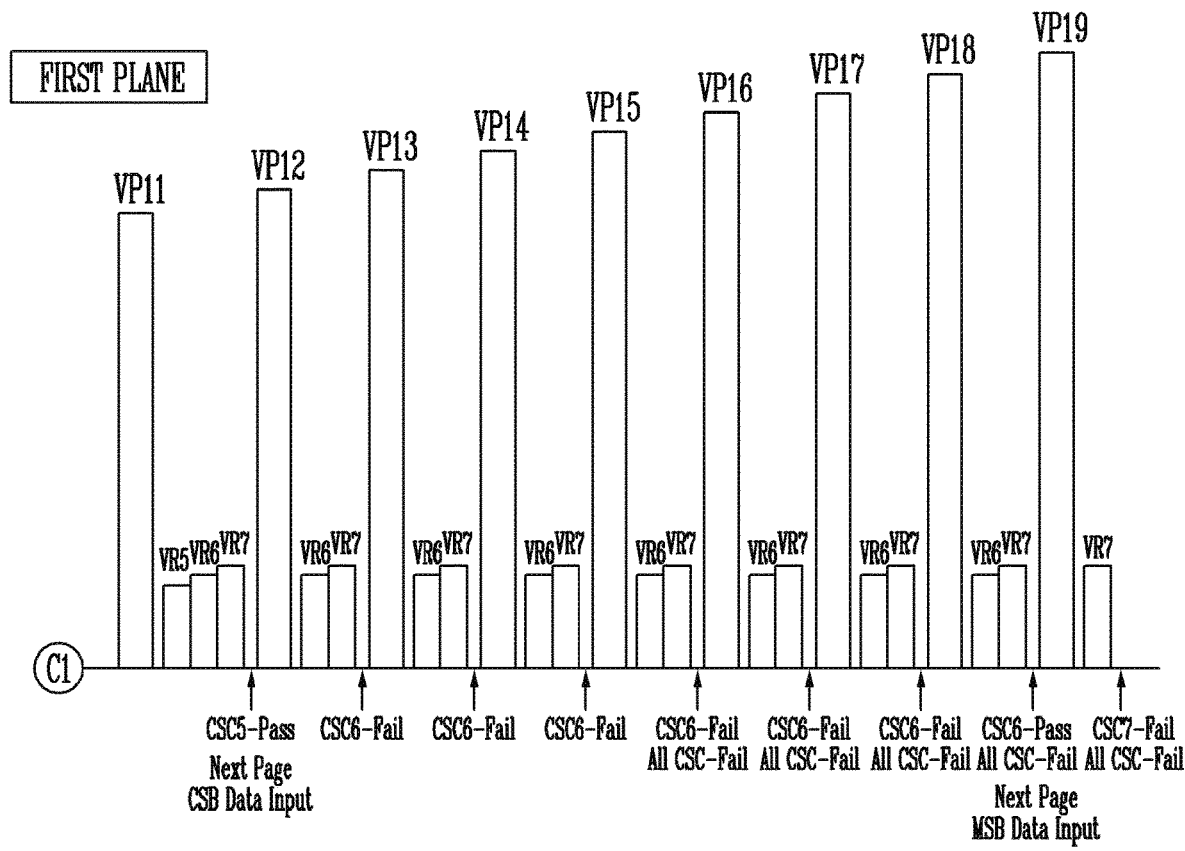
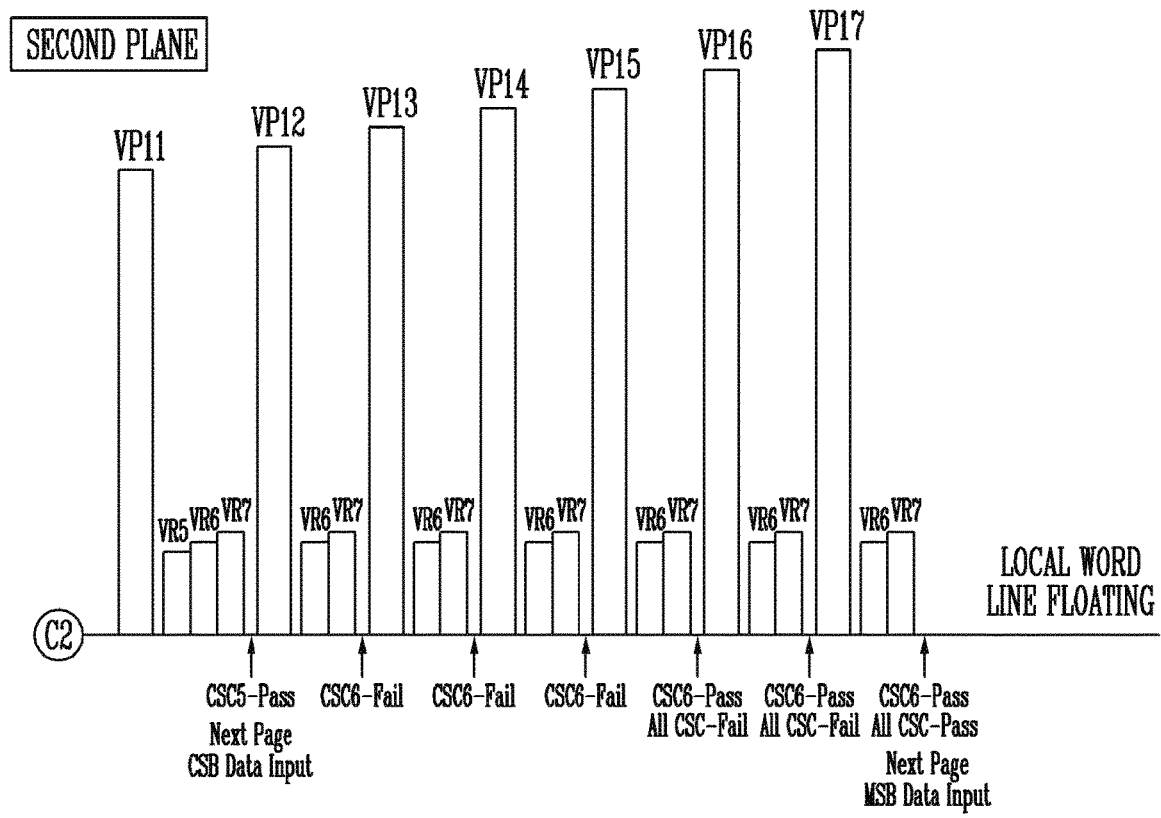

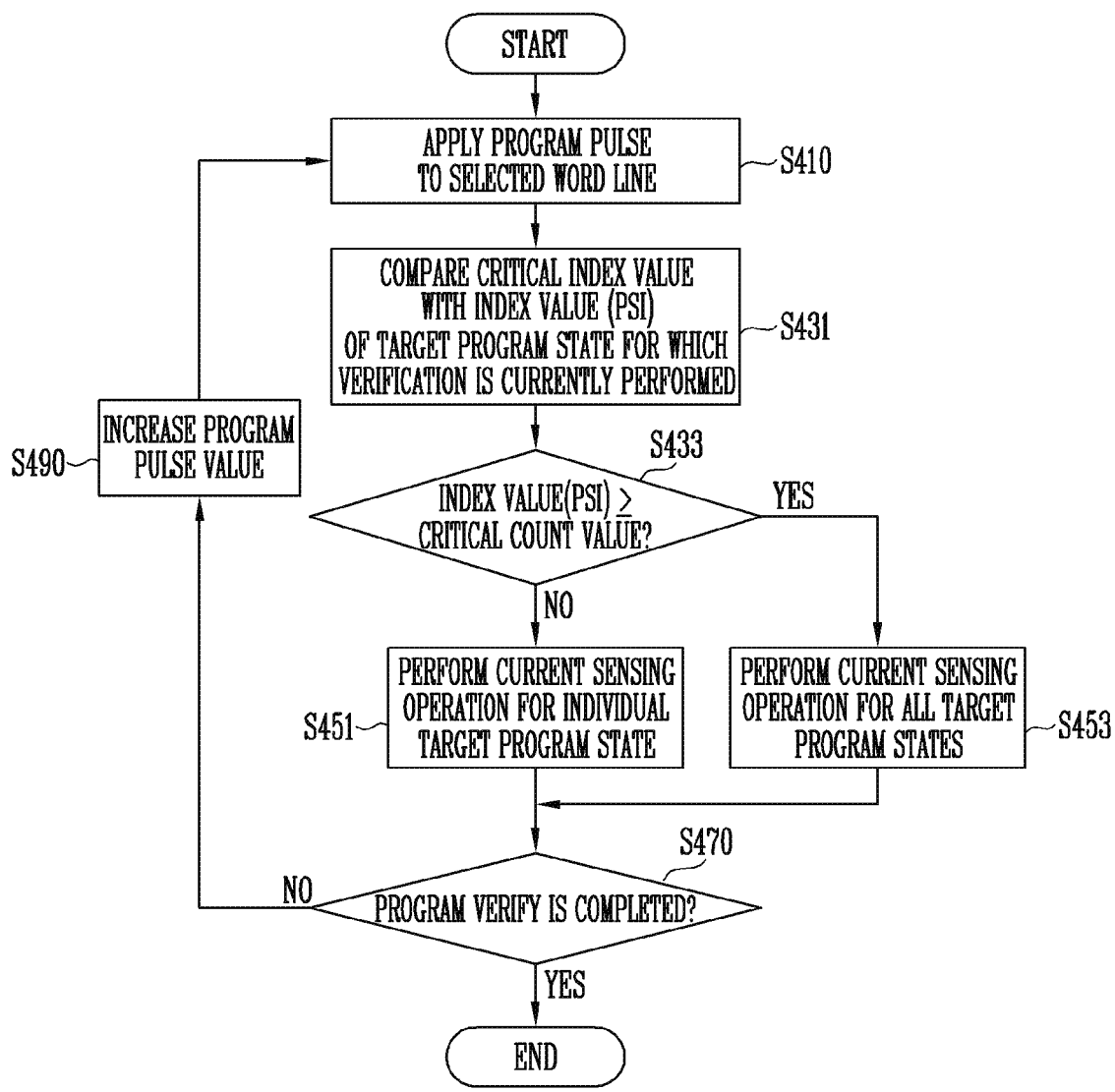

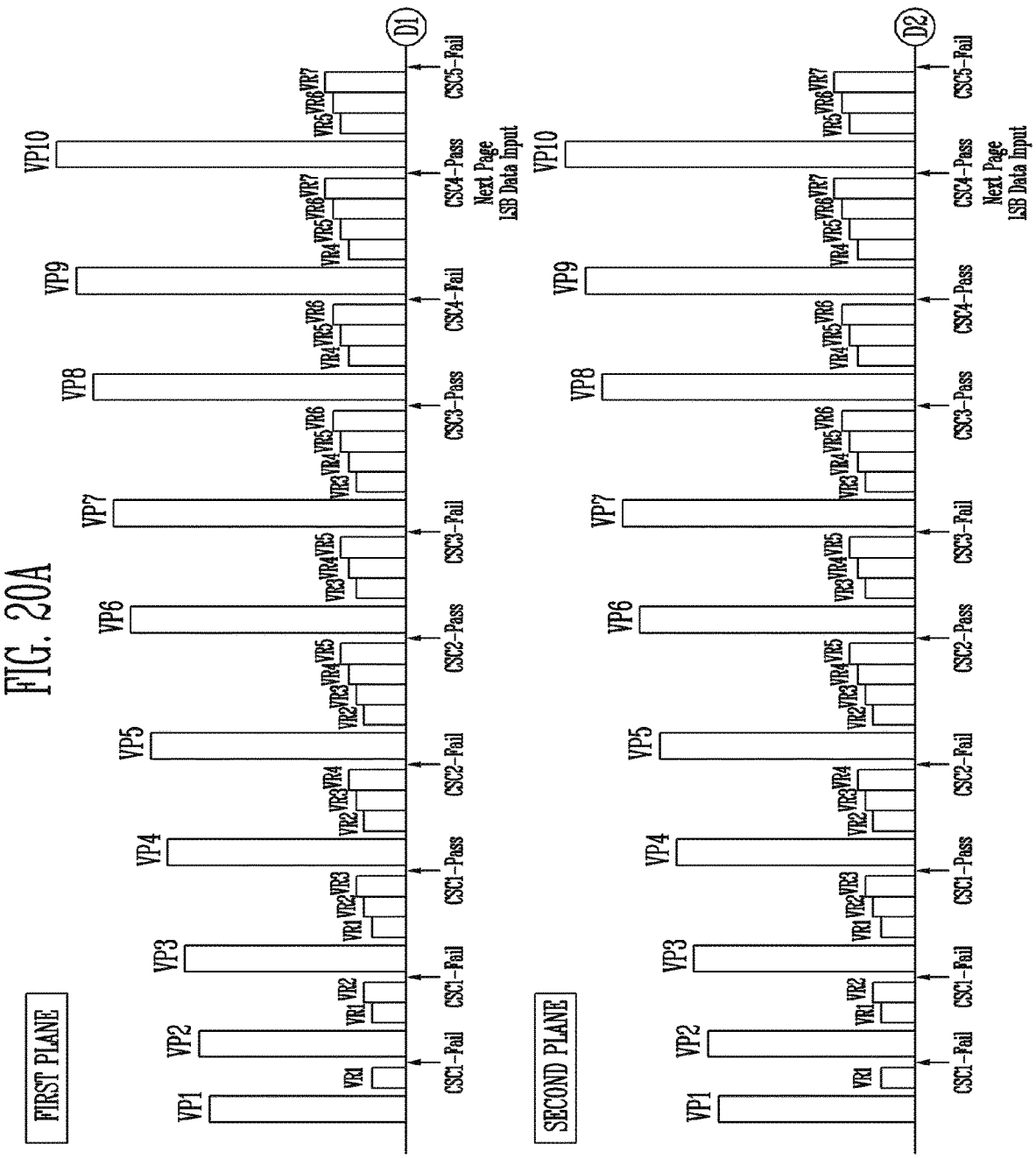

FIG. 20B
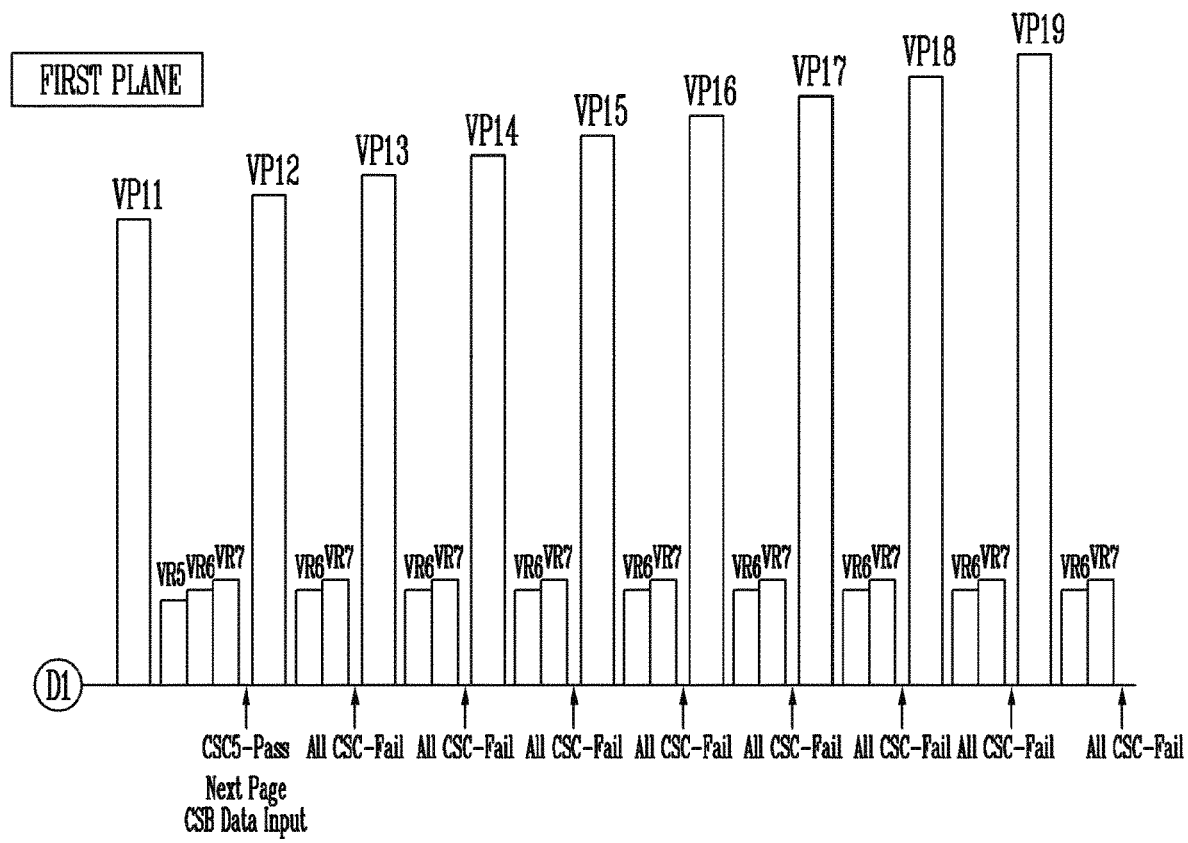
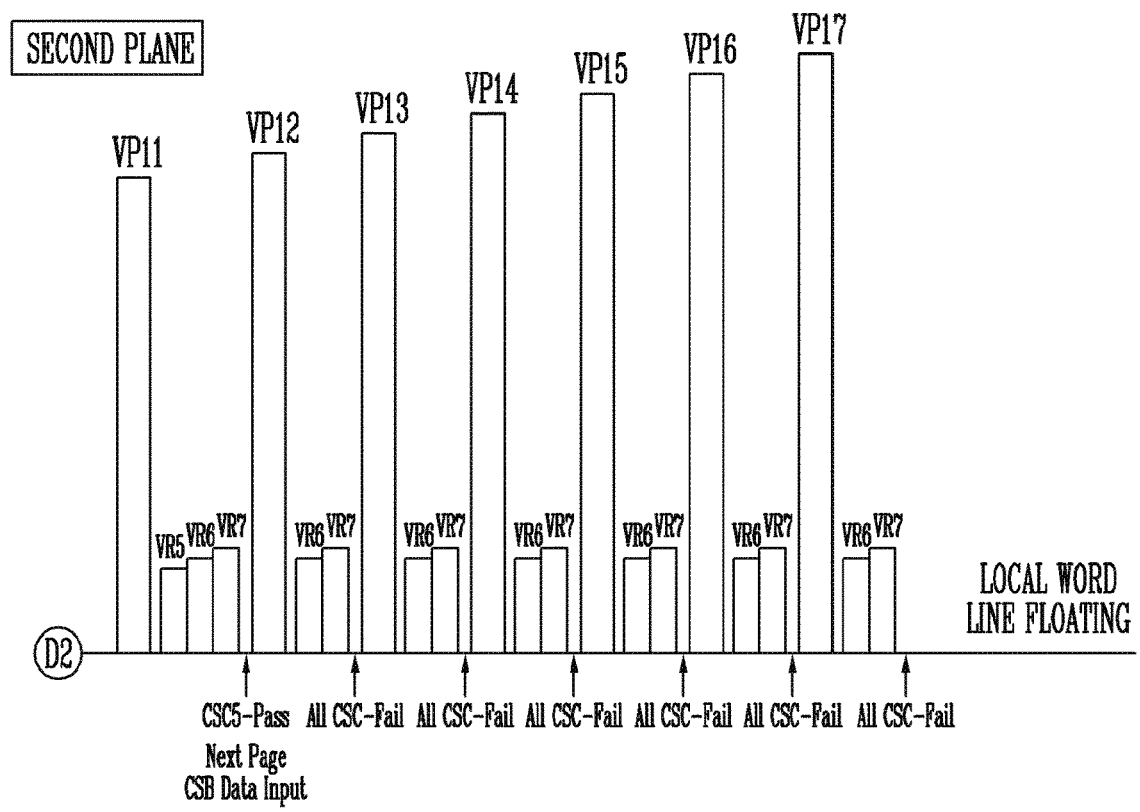

FIG. 23B
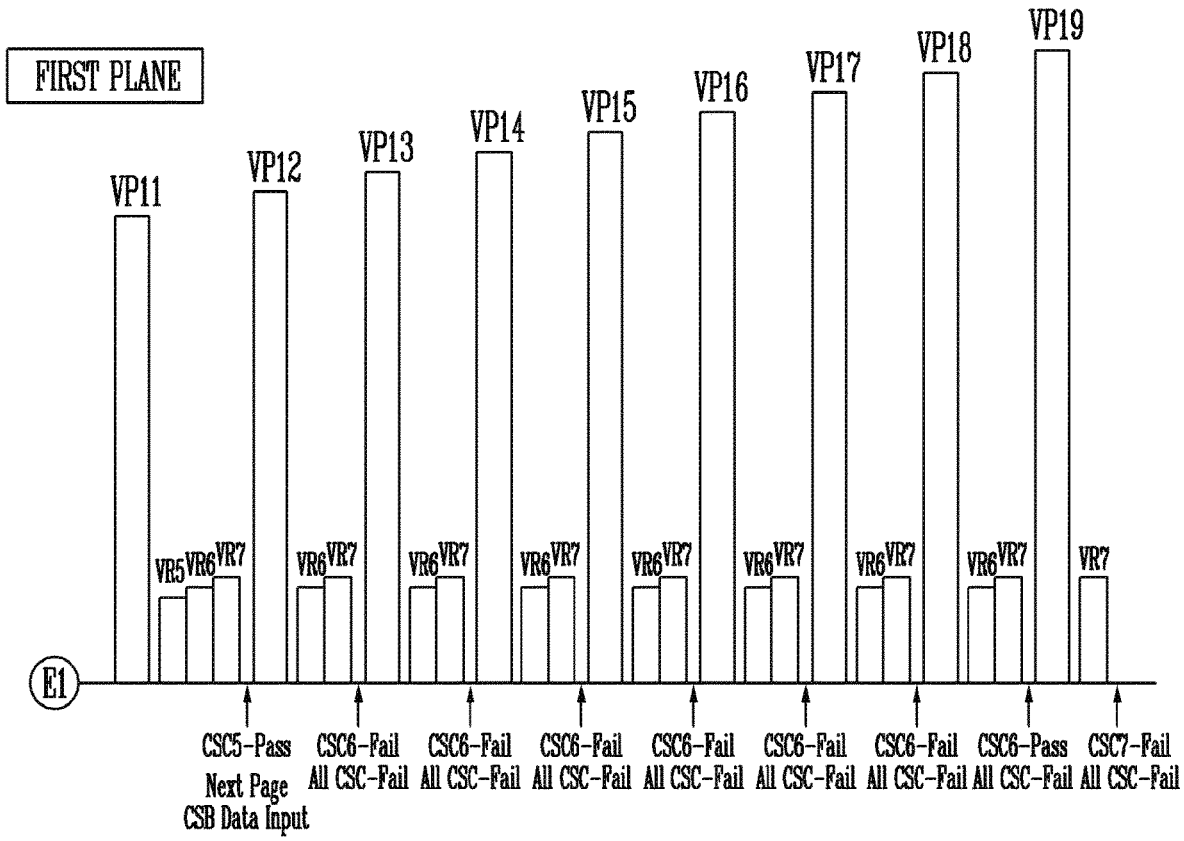
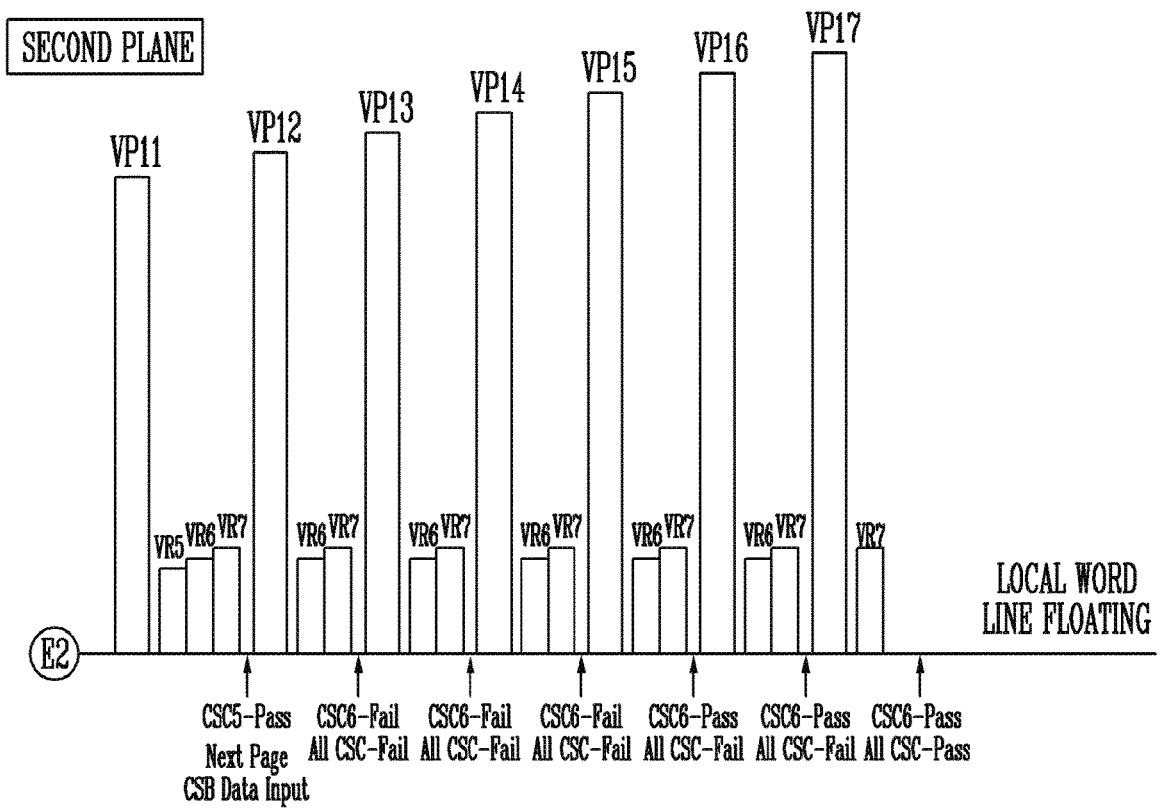

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2018-0168700 filed on Dec. 24, 2018, in the Korean Intellectual Property Office, the entire disclosure of which is incorporated herein by reference.

BACKGROUND

1. Technical Field

Various exemplary embodiments relate generally to an electronic device, and more particularly, to a semiconductor memory device and an operating method thereof.

2. Related Art

A memory device having a two-dimensional structure has strings that are arranged horizontally to a semiconductor substrate. A three-dimensional memory device has the strings arranged vertically to the semiconductor substrate. A plurality of memory cells are typically stacked in a direction vertical to the semiconductor substrates in a three-dimensional memory device, and thus, the three-dimensional memory devices provide a higher degree of integration than two-dimensional memory devices.

SUMMARY

According to an exemplary embodiment, a method of operating a semiconductor memory device includes applying a program pulse to a selected word line and updating a program pulse count value, determining a current sensing mode based upon the program pulse count value, and performing a program verify operation based upon the current sensing mode, wherein the determining of the current sensing mode comprises determining one of an individual state current sensing (CSC) operation for determining verify pass or fail for one target program state and an all-state current sensing operation for determining verify pass or fail for all target program states.

According to another exemplary embodiment, a method of operating a semiconductor memory device includes applying a program pulse to a selected word line and updating a program pulse count value, determining a current sensing mode based upon a program progress, and performing a program verify operation based upon the current sensing mode, wherein the determining of the current sensing mode comprises determining one of an individual state current sensing operation for determining verify pass or fail for one target program state and an all-state current sensing operation for determining verify pass or fail for all target program states.

According to another exemplary embodiment, a semiconductor memory device includes a memory cell array including a plurality of memory cells, a current sensing circuit generating a pass signal or a fail signal based upon a program verify result on selected memory cells, among the plurality of memory cells, and a control logic receiving the pass signal or the fail signal and controlling an operation of the current sensing circuit, wherein the control logic controls the current sensing circuit to perform one of an all-state current sensing operation for determining verify pass or fail for all target program states and an individual state current sensing operation for determining verify pass or fail for one target program state.

BRIEF DESCRIPTION OF THE DRAWINGS

FIGS. 9A and 9B are diagrams illustrating a program operation based on an individual state CSC operation;

FIG. 12 is a detailed flowchart illustrating a method of operating a semiconductor memory device shown in FIG. 11;

FIGS. 13A and 13B are diagrams illustrating a program operation according to an exemplary embodiment of the present disclosure;

FIGS. 16A and 16B are diagrams illustrating a program operation according to an exemplary embodiment illustrated in FIG. 15;

FIG. 19 is a detailed flowchart illustrating a method of operating a semiconductor memory device shown in FIG. 18;

FIGS. 20A and 20B are diagrams illustrating a program operation according to an exemplary embodiment illustrated in FIG. 12;

FIGS. 23A and 23B are diagrams illustrating a program operation according to an exemplary embodiment illustrated in FIG. 22;

DETAILED DESCRIPTION

Advantages and features of the present invention and methods for achieving them will be made clear from exemplary embodiments described below in detail with reference to the accompanying drawings. However, they can be embodied in different forms and should not be construed as limited to the exemplary embodiments set forth herein. Rather, these exemplary embodiments are provided so that this disclosure will be thorough and complete, and will fully convey the scope of the exemplary embodiments to those skilled in the art.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Other expressions describing relationships between components such as "between," "immediately between" or "adjacent to" and "directly adjacent to" may be construed similarly.

Hereinafter, exemplary embodiments of the present disclosure will be described in detail with reference to the accompanying drawings such that those skilled in the art are able to readily implement the technical spirit of the present disclosure.

Various exemplary embodiments of the present disclosure provide a semiconductor memory device having improved reliability.

Various exemplary embodiments of the present disclosure provide a method of operating a semiconductor memory device having improved reliability.

Figure 1:
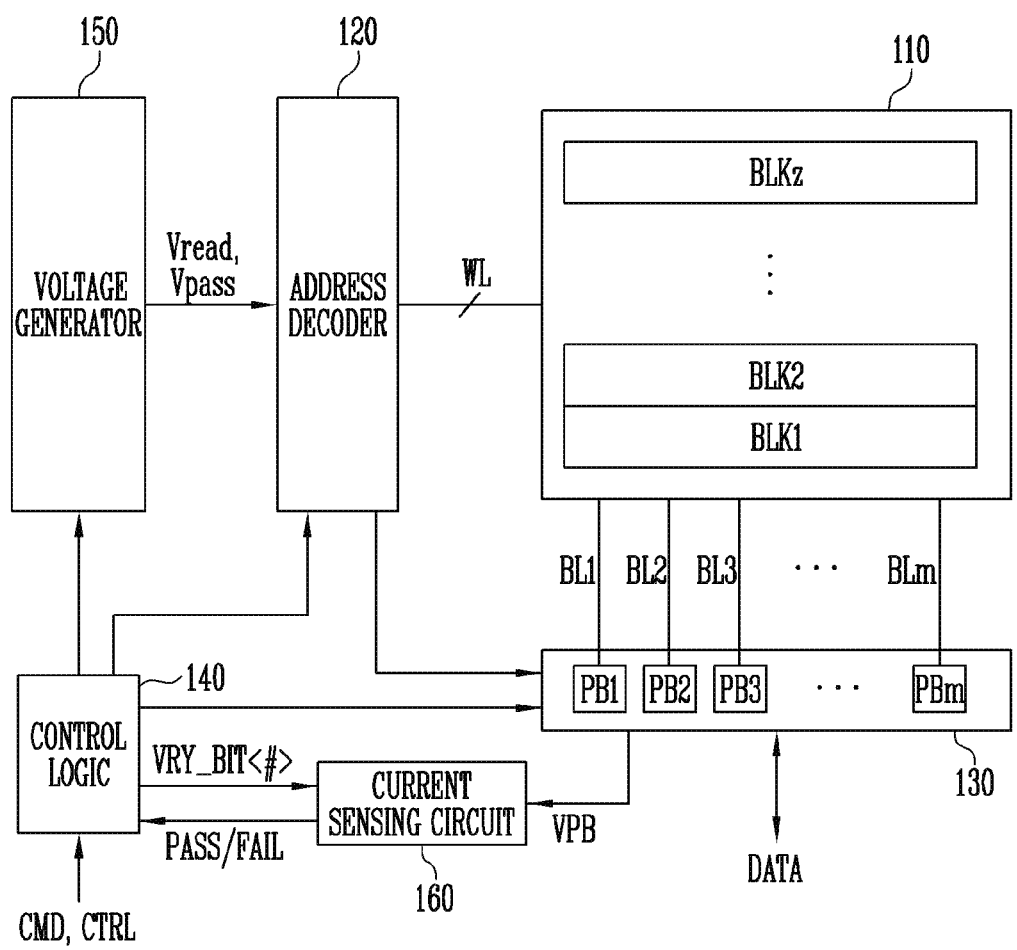
FIG. 1 is a block diagram illustrating a semiconductor memory device according to an exemplary embodiment of the present disclosure.

FIG. 1 is a block diagram illustrating semiconductor memory device 100 according to an exemplary embodiment of the present disclosure.

Referring to FIG. 1, semiconductor memory device 100 may include memory cell array 110, address decoder 120, read and write circuit 130, control logic 140, voltage generator 150, and current sensing circuit 160.

Memory cell array 110 may include a plurality of memory blocks BLK1, BLK2, to BLKz. The plurality of memory blocks BLK1, BLK2, to BLKz may be coupled to address decoder 120 through word lines WL. The plurality of memory blocks BLK1, BLK2, to BLKz may be coupled to read and write circuit 130 through bit lines BL1, BL2, to BLm. Each of the plurality of memory blocks BLK1, BLK2, to BLKz may include a plurality of memory cells. According to an exemplary embodiment, the plurality of memory cells may be non-volatile memory cells having a vertical channel structure. According to an exemplary embodiment of the present disclosure, memory cell array 110 may have a two-dimensional structure or a three-dimensional structure. Each of the plurality of memory cells included in the memory cell array 110 may store data of at least one bit. According to an exemplary embodiment of the present disclosure, each of the memory cells in memory cell array 110 may be a single-level cell (SLC) storing 1-bit data, a multi-level cell (MLC) storing 2-bit data, a triple-level cell (TLC) storing 3-bit data, even a quad-level cell (QLC) storing 4-bit data, or even a cell storing five or more bits of data.

Address decoder 120 may be coupled to memory cell array 110 through word lines WL. Address decoder 120 may be controlled by control logic 140. Address decoder 120 may receive an address through an input/output buffer (not shown in FIG. 1) in semiconductor memory device 100.

Address decoder 120 may be configured to decode a block address of the received address, and, based on the decoded block address, address decoder 120 may select at least one memory block BLK1, BLK2, or BLKz. In addition, address decoder 120 may apply read voltage Vread and pass voltage Vpass to selected and unselected word lines WL, respectively. More specifically, during a read voltage applying operation of a read operation, address decoder 120 may apply read voltage Vread generated by voltage generator 150 to a selected word line of a selected memory block, and address decoder 120 may apply pass voltage Vpass to unselected word lines. Further, during a program verify operation, address decoder 120 may apply a verify voltage generated by voltage generator 150 to the selected word line of the selected memory block, and address decoder 120 may apply the pass voltage Vpass to the unselected word lines.

Address decoder 120 may be configured to decode a column address of the received address. Address decoder 120 may transfer the decoded column address to read and write circuit 130.

A read operation and a program operation of semiconductor memory device 100 may be performed in units of pages. An address received at the request of a read operation and a program operation may include a block address, a row address, and a column address. Address decoder 120 may select one memory block and one word line in response to the block address and the row address. The column address may be decoded by address decoder 120 and provided to read and write circuit 130. In an exemplary embodiment of the present disclosure, the memory cells coupled to one word line may be referred to as a "physical page."

Read and write circuit 130 may include a plurality of page buffers PB1, PB2, to PBm. Read and write circuit 130 may operate as a read circuit during a read operation and as a write circuit during a write operation thereof of memory cell array 110. Page buffers PB1, PB2, to PBm may be coupled to memory cell array 110 through bit lines BL1, BL2, to BLm. During a read operation and a program verify operation, page buffers PB1, PB2, to PBm may continuously supply a sensing current to the bit lines coupled to the memory cells to sense the threshold voltages of the memory cells. Further, page buffers PB1, PB2, to PBm may detect the amount of changes in the current that vary due to the program states of the memory cells through sensing node(s) and latch the result(s) as the sensing data. Read and write circuit 130 may operate in response to page buffer control signals outputted from control logic 140.

During a read operation, read and write circuit 130 may sense data from a memory cell, temporarily store the read data, and output data DATA to the input/output buffer (not shown in FIG. 1) of semiconductor memory device 100. According to an exemplary embodiment, read and write circuit 130 may additionally include a column selection circuit in addition to page buffers (or page registers) PB1, PB2, to PBm.

As shown in FIG. 1, control logic 140 may be coupled to address decoder 120, read and write circuit 130, voltage generator 150, and current sensing circuit 160. Control logic 140 may receive command CMD and control signal CTRL through the input/output buffer (not shown in FIG. 1) of semiconductor memory device 100. Control logic 140 may control the general operations of semiconductor memory device 100 in response to control signal CTRL. In addition, control logic 140 may output a control signal for controlling the precharge potential levels of the sensing nodes of page buffers PB1, PB2, to PBm. Control logic 140 may control read and write circuit 130 to perform a read operation of memory cell array 110.

Control logic 140 may determine the pass or fail status of a verify operation performed on either a predetermined target program state or the entire target program states in response to pass/fail signals PASS/FAIL received from current sensing circuit 160.

During a read operation, voltage generator 150 can generate the read voltage Vread and the pass voltage Vpass in response to a control signal outputted from control logic 140. In voltage generator 150, a plurality of pumping capacitors receiving an internal power voltage may be provided to generate a plurality of varying voltage levels. Control logic 140 may control voltage generator 150 to selectively activate the plurality of pumping capacitors to generate a plurality of voltages.

During a verify operation, current sensing circuit 160 may generate a reference current in response to allowable bit VRY_BIT<#> received from control logic 140. Current sensing circuit 160 may also output pass/fail signal PASS/FAIL by comparing a reference voltage (generated by the reference current) and sensing voltage VPB received from page buffers PB1 to PBm of in read and write circuit 130.

More specifically, current sensing circuit 160 may determine whether the verify operation corresponding to either the predetermined target program state or the entire target program states is completed by comparing a voltage generated by a value from a bit line sense latch (see FIG. 6) included in each of page buffers PB1 to PBm. Bit line sense latch LAT1, LAT2, LAT3, etc. included in each of page buffers PB1, PB2, to PBm will be described below with reference to FIG. 6.

Address decoder 120, read and write circuit 130, and voltage generator 150 may be a part of a 'peripheral circuit' that is configured to perform a read operation, a write operation, and an erase operation on memory cell array 110. Control logic 140 may control the peripheral circuit to perform a read operation, a write operation, and an erase operation on memory cell array 110.

Figure 2:
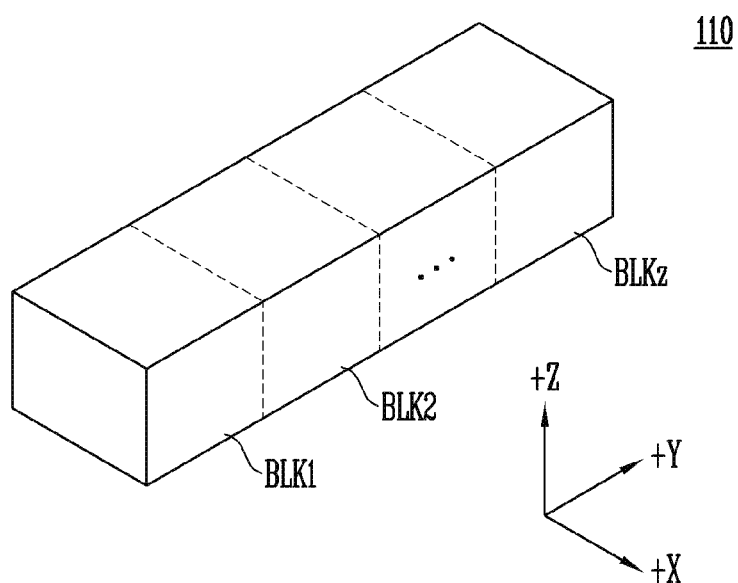
FIG. 2 is a diagram illustrating an exemplary embodiment of a memory cell array of FIG. 1.

FIG. 2 shows an exemplary embodiment of memory cell array 110 of FIG. 1.

Referring to FIG. 2, memory cell array 110 may include a plurality of memory blocks BLK1, BLK2, to BLKz. Each of memory blocks BLK1, BLK2, to BLKz can have a three-dimensional structure. Each memory block may include a plurality of memory cells stacked over a substrate. The plurality of memory cells may be arranged in +X direction, +Y direction, and +Z direction. The circuit structure of each memory block will be described in detail with reference to FIGS. 3 and 4.

Figure 3:
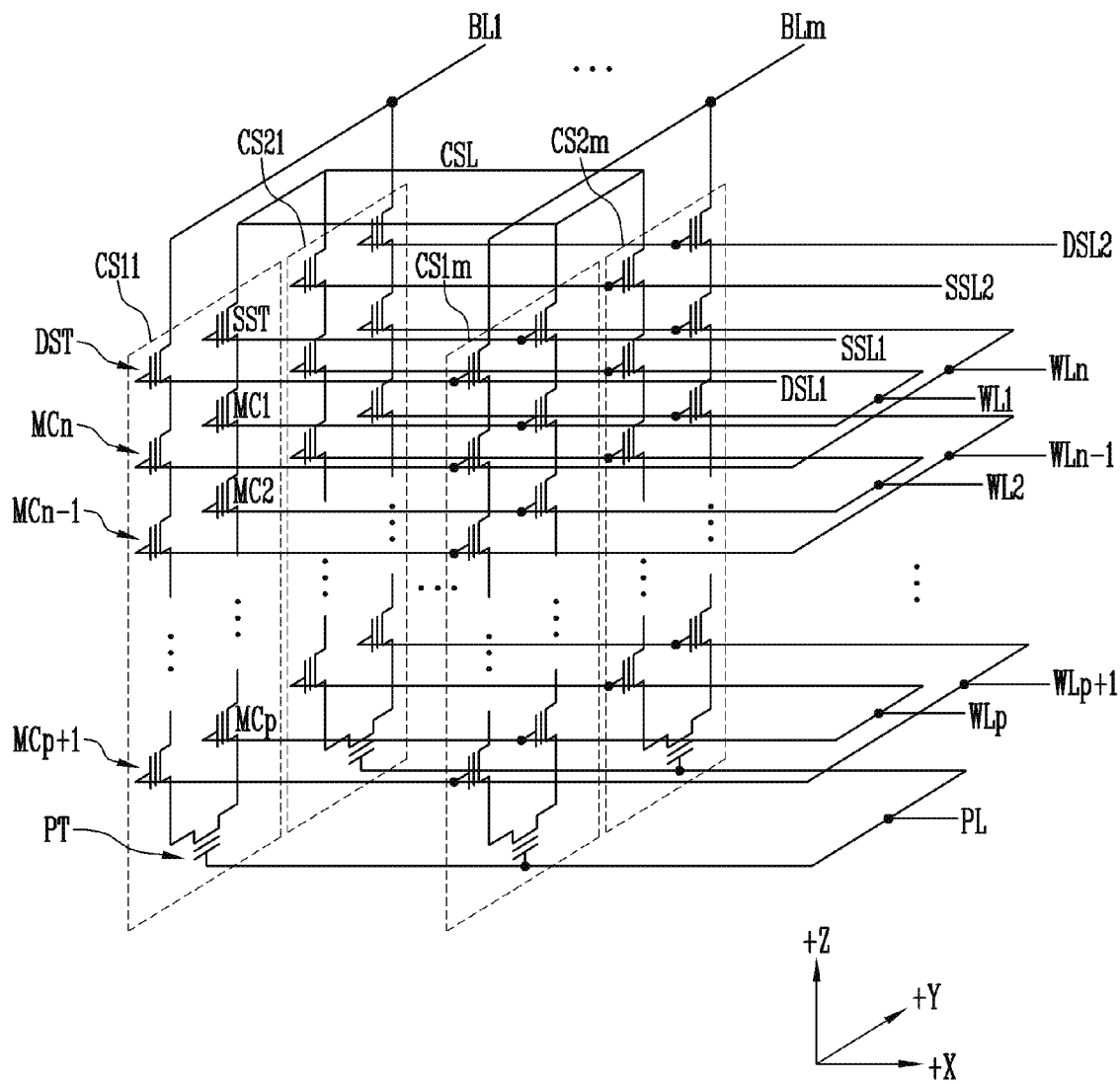
FIG. 3 is a circuit diagram illustrating one (BLKa) of memory blocks BLK1, BLK2, to BLKz shown in FIG. 2.

FIG. 3 is a circuit diagram illustrating one (BLKa) of memory blocks BLK1, BLK2, to BLKz shown in FIG. 2.

Referring to FIG. 3, memory block BLKa may include a plurality of cell strings CS11, CS12, to CS1$m$ and CS21, CS22, to CS2$m$. According to an exemplary embodiment, each of cell strings CS11, CS12, to CS1$m$ and CS21, CS22, to CS2$m$ may be formed in a U shape. In memory block BLKa, the 'm' number of cell strings may be arranged in a row direction (i.e., +X direction). FIG. 3 shows two cell strings arranged in a column direction (i.e., +Y direction). However, it should be readily understood that three or more cell strings may be arranged in the column direction.

Each of cell strings CS11, CS12, to CS1$m$ and CS21, CS22, to CS2$m$ may include at least one source select transistor SST, first to nth memory cells MC1, MC2, to MCn, pipe transistor PT, and at least one drain select transistor DST.

Each of select transistors SST and DST and each of memory cells MC1, MC2, to MCn may have similar structures to each other. According to an exemplary embodiment, each of select transistors SST and DST and memory cells MC1, MC2, to MCn may include a channel layer, a tunneling insulating layer, a charge storage layer, and a blocking insulating layer. According to an exemplary embodiment, a pillar for providing a channel layer may be provided in each cell string. According to an exemplary embodiment, a pillar for providing at least one of the channel layer, the tunneling insulating layer, the charge storage layer, and the blocking insulating layer can be provided to each cell string.

Source select transistor SST of each cell string may be coupled between common source line CSL and memory cells MC1, MC2, to MCp.

According to an exemplary embodiment, source select transistors SST of the cell strings arranged in a same row may be coupled to a same source select line SSL extending in a row direction, and source select transistors SST of the cell strings arranged in different rows may be coupled to the different source select lines. In FIG. 3, source select transistors SST of cell strings CS11, CS12, to CS1$m$ in the first row may be coupled to first source select line SSL1. Source select transistors SST of cell strings CS21, CS22, to CS2$m$ in the second row may be coupled to second source select line SSL2.

According to an exemplary embodiment of the present disclosure, it is also possible that source select transistors SST of cell strings CS11, CS12, to CS1$m$ and CS21, CS22, to CS2$m$ may be coupled in common to one source select line SSL.

First to nth memory cells MC1, MC2, to MCn of each cell string may be coupled between source select transistor SST and drain select transistor DST.

First to nth memory cells MC1, MC2, to MCn may be divided into first to pth memory cells MC1, MC2, to MCp and (p+1)th to nth memory cells MCp+1 to MCn. First to pth memory cells MC1 to MCp may be sequentially arranged in a reverse direction to the +Z direction and may be coupled in series between source select transistor SST and pipe transistor PT. (p+1)th to nth memory cells MCp+1, MCp+2, to MCn may be sequentially arranged in the +Z direction and may be coupled in series between pipe transistor PT and drain select transistor DST. First to pth memory cells MC1, MC2, to MCp and the (p+1)th to nth memory cells MCp+1, MCp+2, to MCn may be coupled to each other through pipe transistor PT. Gates of first to nth memory cells MC1, MC2, to MCn of each cell string may be coupled to first to nth word lines WL1, WL2, to WLn, respectively.

The gate of pipe transistor PT of each cell string can be coupled to a pipe line PL.

Drain select transistor DST of each cell string may be coupled between a corresponding bit line and memory cells MCp+1, MCp+2, to MCn. The cell strings arranged in the row direction may be coupled to a drain select line DSL extending in the row direction. Drain select transistors DST of cell strings CS11, CS12, to CS1m in the first row may be coupled to first drain select line DSL1. Drain select transistors DST of the cell strings CS21, CS22, to CS2m in the second row may be coupled to second drain select line DSL2.

Cell strings arranged in the column direction may be coupled to a bit line extending in the column direction. In FIG. 3, cell strings CS11 and CS21 in the first column may be coupled to first bit line BL1. Strings CS1m and CS2m in the mth column be coupled to mth bit line BLm.

A single page refers to the memory cells coupled to the same word line WL arranged in the cell strings arranged in the row direction. For example, a single page may be formed by the memory cells coupled to first word line WL1 in cell strings CS11, CS12, to CS1m in the first row. Another page may be formed by the memory cells coupled to first word line WL1 in cell strings CS21, CS22, to CS2m in the second row. When one of drain select lines DSL1 and DSL2 is selected, the cell strings arranged in one row direction may be selected. When one of first to nth word lines WL1, WL2, to WLn is selected, one page may be selected from the selected cell strings.

According to an exemplary embodiment of the present disclosure, it may be possible that even bit lines and odd bit lines may replace first to mth bit lines BL1, BL2, to BLm. In addition, even cell strings of cell strings CS11, CS12, to CS1m or CS21, CS22, to CS2m arranged in the row direction may be coupled to the even bit lines, respectively, and odd cell strings of cell strings CS11, CS12, to CS1m or CS21, CS22, to CS2m arranged in the row direction may be coupled to the odd bit lines, respectively.

According to an exemplary embodiment, one or more of first to nth memory cells MC1, MC2, to MCn may serve as a dummy memory cell, for example, to reduce an electric field between source select transistor SST and memory cells MC1. MC2, to MCp. Alternatively, one or more dummy memory cells may be provided to reduce an electric field between drain select transistor DST and memory cells MCp+1, MCp+2, to MCn. More dummy memory cells may help to improve the operational reliability of memory block BLKa, but it may lead to increased size of memory block BLKa. On the other hand, less dummy memory cells may help to reduce the size of the memory block BLKa, but this may be realized at the expense of the reduced operational reliability of memory block BLKa.

In order to efficiently control the dummy memory cells, each dummy memory cell may have a required threshold voltage. Before or after an erase operation on memory block BLKa, program operations may be performed on a portion or entirety of the dummy memory cells. When an erase operation is performed after performing a program operation, dummy memory cells may have required threshold voltages by controlling a voltage applied to dummy word lines coupled to the dummy memory cells.

Figure 4:
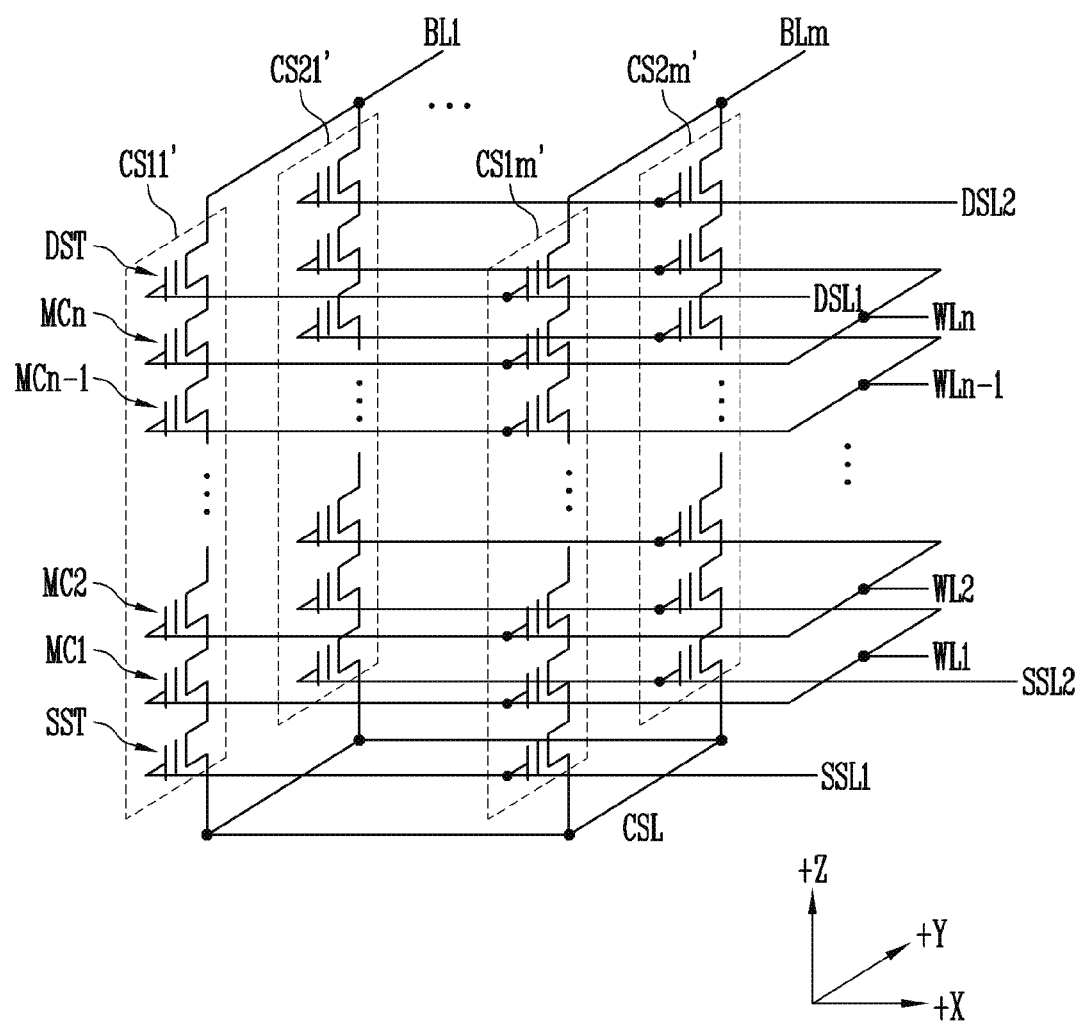
FIG. 4 is a circuit diagram illustrating another exemplary embodiment (BLKb) of one of the memory blocks BLK1, BLK2, to BLKz shown in FIG. 2.

FIG. 4 is a circuit diagram illustrating another exemplary embodiment (BLKb) of one of memory blocks BLK1, BLK2, to BLKz shown in FIG. 2.

Referring to FIG. 4, memory block BLKb may include a plurality of cell strings CS11', CS12', to CS1m' and CS21', CS22', to CS2m'. Each of the plurality of cell strings CS11', CS12', to CS1m' and CS21', CS22', to CS2m' may extend in the +Z direction. Each of the plurality of cell strings CS11', CS12', to CS1m' and CS21', CS22', to CS2m' may include at least one source select transistor SST, first to nth memory cells MC1, MC2, to MCn, and at least one drain select transistor DST which are stacked on a substrate (not shown in FIG. 4) under memory block BLK1'.

Source select transistor SST of each cell string may be coupled between common source line CSL and first to nth memory cells MC1, MC2, to MCn. Source select transistors SST of the cell strings arranged in the same row may be coupled to the same source select line SSL. Source select transistors SST of the cell strings CS11' to CS1m' arranged in the first row may be coupled to first source select line SSL1. Source select transistors SST of cell strings CS21' to CS2m' arranged in the second row may be coupled to second source select line SSL2. According to an exemplary embodiment of the present disclosure, it is possible that source select transistors SST of cell strings CS11' to CS1m and CS21' to CS2m' may be commonly coupled to a single source select line.

First to nth memory cells MC1, MC2, to MCn of each cell string may be coupled between source select transistor SST and drain select transistor DST. The gates of first to nth memory cells MC1, MC2, to MCn may be coupled to first to nth word lines WL1, WL2, to WLn, respectively.

Drain select transistor DST of each cell string may be coupled between the corresponding bit line and memory cells MC1, MC2, to MCn. Drain select transistors DST of cell strings arranged in a row direction may be coupled to drain select line DSL extending in the row direction. Drain select transistors DST of cell strings CS11' to CS1m' in the first row may be coupled to first drain select line DSL1. Drain select transistors DST of cell strings CS21' to CS2m' in the second row may be coupled to second drain select line DSL2.

As a result, memory block BLKb shown in FIG. 4 may have a similar equivalent circuit to memory block BLKa shown in FIG. 3 except that pipe transistor PT is removed from each cell string of memory block BLKb.

According to another exemplary embodiment, even bit lines and odd bit lines may replace first to mth bit lines BL1 to BLm. In addition, even cell strings of cell strings CS11' to CS1m' or CS21' to CS2m' arranged in the row direction may be coupled to the even bit lines, respectively, and odd cell strings of cell strings CS11' to CS1m' or CS21' to CS2m' arranged in the row direction may be coupled to the odd bit lines, respectively.

According to an exemplary embodiment, at least one of first to nth memory cells MC1 to MCn may serve as a dummy memory cell. For example, one or more dummy memory cells may be provided to reduce an electric field between source select transistor SST and first to nth memory cells MC1 to MCn. Alternatively, one or more dummy memory cells may be provided to reduce an electric field between drain select transistor DST and memory cells MC1 to MCn. When more dummy memory cells are provided, the operational reliability of the memory block BLKb may be improved, whereas the size of the memory block BLKb may be increased. When fewer memory cells are provided, the size of memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
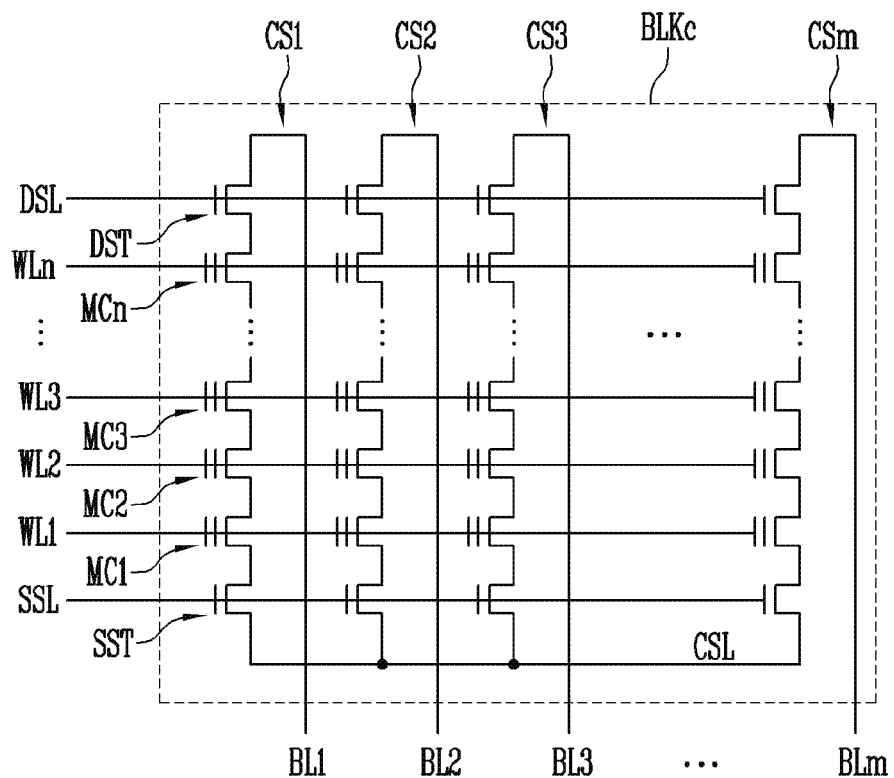
FIG. 5 is a circuit diagram illustrating an exemplary embodiment of a memory block BLKc which is one of the memory blocks BLK1, BLK2, to BLKz included in a memory cell array 110 as shown in FIG. 1.

FIG. 5 is a circuit diagram illustrating an exemplary embodiment (memory block BLKc) of one of memory blocks BLK1, BLK2, to BLKz included in memory cell array 110 as shown in FIG. 1.

Referring to FIG. 5, memory block BLKc may include the plurality of cell strings CS1 to CSm. The plurality of cell strings CS1 to CSm may be coupled to the plurality of bit lines BL1 to BLm, respectively. Each of cell strings CS1 to CSm may include at least one source select transistor SST, first to nth memory cells MC1 to MCn, and at least one drain select transistor DST.

Each of select transistors SST and DST and each of memory cells MC1 to MCn may have similar structures to each other. According to an exemplary embodiment, each of select transistors SST and DST and memory cells MC1 to MCn may include a channel layer, a tunneling insulating layer, a charge storage layer, and a blocking insulating layer. According to an exemplary embodiment, a pillar for providing a channel layer may be provided in each cell string. According to an exemplary embodiment, a pillar for providing at least one of the channel layer, the tunneling insulating layer, the charge storage layer, and the blocking insulating layer may be provided to each cell string.

Source select transistor SST of each cell string may be coupled between common source line CSL and first to nth memory cells MC1 to MCn.

First to nth memory cells MC1 to MCn of each cell string may be coupled between source select transistor SST and drain select transistor DST.

Drain select transistor DST of each cell string may be coupled between a corresponding bit line and memory cells MC1 to MCn.

Memory cells coupled to the same word line may form a single page. When drain select line DSL is selected, cell strings CS1 to CSm may be selected. When one of word lines WL1 to WLn is selected, one page may be selected from selected cell strings.

According to another exemplary embodiment, even bit lines and odd bit lines may replace first to mth bit lines BL1 to BLm. Even cell strings of cell strings CS1 to CSm may be coupled to the even bit lines, respectively, and odd cell strings thereof may be coupled to the odd bit lines, respectively.

As described above, memory cells coupled to one word line may be referred to as a "physical page." In the example of FIG. 5, 'm' memory cells coupled on one of the plurality of word lines WL1 to WLn, among the memory cells included in memory block BLKc, may constitute a single physical page.

As shown in FIGS. 2 to 4, memory cell array 1100 may have a three-dimensional structure. Alternatively, as shown in FIG. 5, memory cell array 110 may have a two-dimensional structure.

Figure 6:
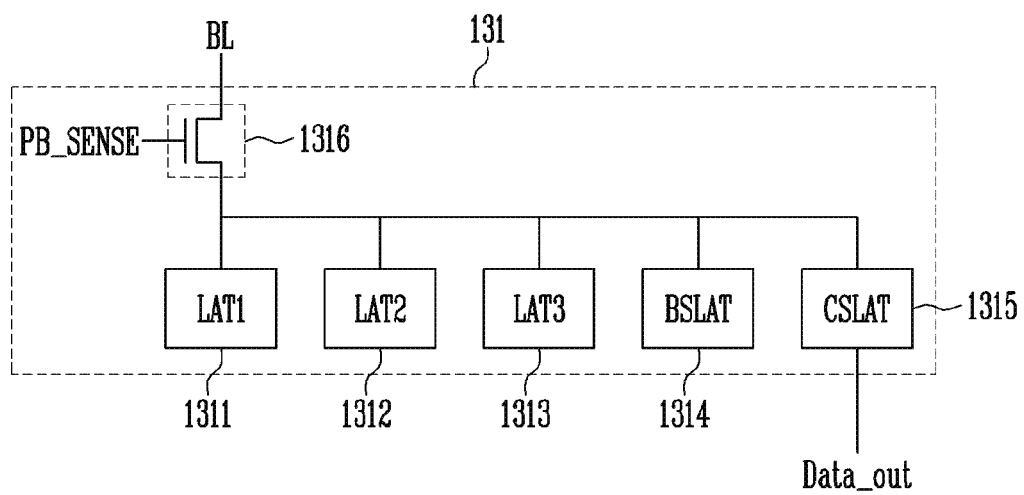
FIG. 6 is a schematic diagram illustrating a page buffer 131 according to an exemplary embodiment of the present disclosure.

FIG. 6 is a schematic diagram illustrating page buffer 131 according to an exemplary embodiment of the present disclosure.

During a read or program verify operation, data stored in a memory cell or a threshold voltage of the memory cell may be sensed by bit line BL. Page buffer 131 may include bit line sense latch (BSLAT) 1314 storing a sensing result. In addition, bit line sense latch 1314 may be used to determine a program permission voltage or a program inhibition voltage to be applied to bit line BL during a program execution operation.

Page buffer 131 may include a plurality of data latches (1311, 1312, and 1313) storing externally input program data during a program operation. For example, an exemplary embodiment shown in FIG. 6, page buffer 131 may store 3-bit data. Data latch (LAT1) 1311 may store most significant bit (MSB). Data latch (LAT2) 1312 may store central significant bit (CSB). Data latch (LAT3) 1313 may store least significant bit (LSB). Data latches 1311, 1312, and 1313 may maintain the stored program data until the memory cell is completely programmed.

In addition, cache latch (CSLAT) 1315 may receive the data read from the memory cell from bit line sense latch 1314 during a read operation and output the read data to an outside of page buffer 131 through data output line Data_out.

Page buffer 131 may include bit line connection transistor 1316 controlling connections between bit line BL, bit line sense latch 1314, data latches 1311, 1312, and 1313, and cache latch 1315. Bit line connection transistor 1316 may be controlled by bit line connection signal PB_SENSE. For example, when data is read from a memory cell, bit line connection transistor 1316 may be turned on to electrically connect bit line BL and bit line sense latch 1314 to each other. In addition, bit line connection transistor 1316 may be turned off when the data stored in bit line sense latch 1314 is transferred to cache latch 1315.

In a verify process of a program operation of a memory cell, a value indicating whether a threshold voltage of the memory cell coupled to the corresponding bit line BL is greater than a verify voltage corresponding to a target state may be stored in bit line sense latch 1314. For example, when the threshold voltage of the memory cell coupled to bit line BL is smaller than the verify voltage corresponding to the target state, a value of "0" may be stored in bit line sense latch 1314. While the value of "0" is stored in bit line sense latch 1314, a program permission voltage may be applied to bit line BL if a program pulse is applied.

As the program process proceeds, when the threshold voltage of the memory cell coupled to bit line BL is greater than the verify voltage corresponding to the target state, a value of "1" may be stored in bit line sense latch 1314. When the value of "1" is stored in bit line sense latch 1314, the value of bit line sense latch 1314 may be maintained at "1" in a subsequent program loop. When a program pulse is applied, a program inhibition voltage may be applied to bit line BL. Since it might not be necessary to increase a threshold voltage of a memory cell corresponding to erase state E, bit line sense latch 1314 of page buffer 131 which is coupled to the memory cell corresponding to erase state E may have a value of "1" from the beginning of program.

Therefore, whether the memory cell coupled to bit line BL of page buffer 131 is programmed to a target program state may be identified by the value of bit line sense latch 1314. Current sensing circuit 160 may perform a current sensing operation based upon the value stored in bit line sense latch 1314. Thus, current sensing circuit 160 may determine whether a verify operation corresponding to a predetermined target program state has been completed, or a verify operation corresponding to all program states has been completed.

Figure 7:
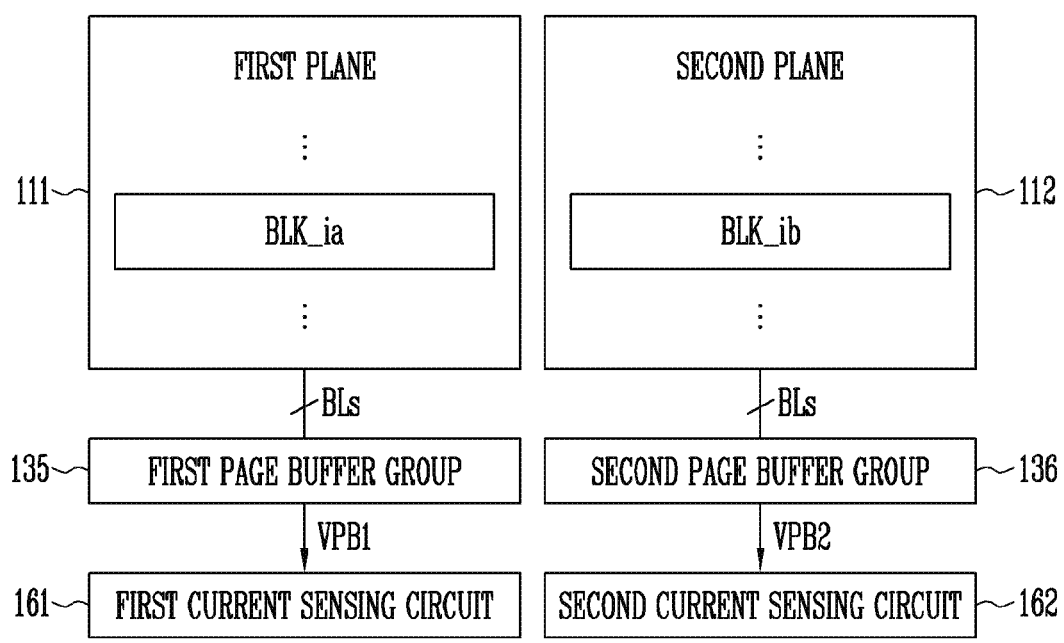
FIG. 7 is a block diagram illustrating an exemplary embodiment of a semiconductor memory device including a plurality of planes.

FIG. 7 is a block diagram of semiconductor memory device 100 including a plurality of planes according to an exemplary embodiment of the present disclosure.

Shown in FIG. 7, are first and second planes 111 and 112 among many planes of memory cell array 110 of semiconductor memory device 100. Although only two planes 111 and 112 are shown in FIG. 7, memory cell array 110 of semiconductor memory device 100 according to an exemplary embodiment may be configured to include three or more planes.

Each of first plane 111 and second plane 112 may include a plurality of memory blocks. First plane 111 and second plane 112 may be coupled to first page buffer group 135 and second page buffer group 136, respectively, through bit lines BLs. First page buffer group 135 may be coupled to first current sensing circuit 161. Second page buffer group 136 may be coupled to second current sensing circuit 162. First page buffer group 135 and second page buffer group 136 may constitute read and write circuit 130 shown in FIG. 1.

When memory cell array 110 includes two planes, semiconductor memory device 100 may perform a program operation on the memory blocks in both planes at the same time. That is, a program operation may be performed on memory block BLK_ia included in first plane 111 and memory block BLK_ib included in second plane 112 at the same time.

While a program operation is performed on memory blocks BLK_ia and BLK_ib, first current sensing circuit 161 may output the pass or fail signal PASS or FAIL in order to perform a verify operation on the memory cells in memory block BLK_ia. Pass or fail signal PASS or FAIL is generated based on comparing the reference voltage generated by the reference current and first sensing voltage VPB1 received from the page buffers in first page buffer group 135. Similarly, second current sensing circuit 162 may output pass or fail signal PASS or FAIL in order to perform a verify operation on the memory cells in memory block BLK_ib. Pass or fail signal PASS or FAIL is generated based on comparing the reference voltage generated by the reference current and second sensing voltage VPB2 received from page buffers included in second page buffer group 136.

When performing a program operation on semiconductor memory device 100 having a plurality of planes, unless a verify operation that is directed to the target program state of the memory cells included in, for example, first plane 111 is completed, a verify operation for the next target program state might not be performed. In this case, even when the program verification is completed on the memory cells included in second plane 112, a verify operation might not be performed for the next target program state. This may cause an unnecessary program pulse to be continuously applied to the memory cells of second plane 112 causing disturbance.

According to an exemplary embodiment of the present disclosure, a verify operation on all target program states (rather than performing a verify operation on an individual program state) is performed in semiconductor memory device 100, when a predetermined condition is satisfied. Therefore, in this manner, even when a program has failed to perform properly due to presence of a slow cell in one of the plurality of planes, it is still possible to perform a verify operation of determining pass or fail of another plane, which may be normal. When the pass status is determined on the normal plane by a verify operation, then the word line of the corresponding normal plane is floated so that no additional program pulse would be applied to the normal plane. Accordingly, this prevents disturbances occurring due to application of an unnecessary program pulse.

Figure 8:
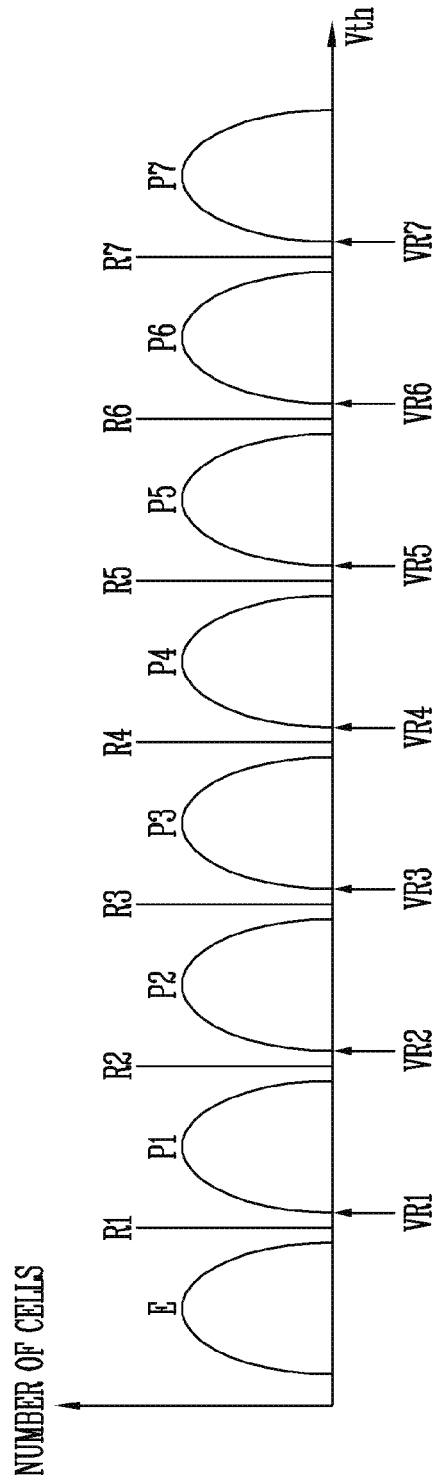
FIG. 8 is a graph illustrating target program states of triple-level cells.

FIG. 8 is a graph illustrating target program states of triple-level cells (TLC).

Referring to FIG. 8, a triple level cell (TLC) in general has eight threshold voltage states. Among the eight threshold voltage states of triple level cell (TLC), there are an erase state E and seven target program states, i.e., first to seventh target program states P1, P2, to P7. There are bit codes corresponding to erase state E and first to seventh target program states P1, P2, to P7. Various bit codes may be assigned to the eight program states, i.e., erase state E and first to seventh program states P1, P2, to P7.

The eight threshold voltage states of triple level cell (TLC) may be divided based upon first to seventh read voltages R1, R2, to R7. In addition, first to seventh verify voltages VR1, VR2, to VR7 may be used to determine whether the memory cells corresponding to the respective target program states of a program operation are completely programmed.

For example, second verify voltage VR2 may be applied to a word line to verify the memory cells that correspond to second target program state P2 as seen in FIG. 8 among the memory cells in a selected physical page. The memory cells corresponding to second target program state P2 may be distinguished by data latches 1311, 1312, and 1313 of FIG. 6. For example, when "101" is the bit code corresponding to the second target program state, the memory cells that are to be programmed to second target program state P2 are the memory cells that are coupled to page buffer 131 having data latches 1311, 1312, and 1313, in which the values "1," "0," and "1" are stored, respectively. Among the memory cells that could be programmed to second target program state P2, the memory cell that has not yet been programmed to the second target program state P2 is a memory cell coupled to bit line sense latch 1314 having the value of "0", and the memory cell that has been completely programmed to second target program state P2 is a memory cell coupled to bit line sense latch 1314 having the value of "1".

By determining a threshold voltage of a memory cell by applying second verify voltage VR2 to the word line and performing bit line (BL) sensing, the value of bit line sense latch 1314 can be maintained at "0" when the threshold voltage of the memory cell is less than second verify voltage VR2. When the threshold voltage of the memory cell is greater than second verify voltage VR2, bit line sense latch 1314 may then have a value of "1." When the value of bit line sense latch 1314 is "1," a program inhibition voltage may be applied to the bit line BL coupled to the corresponding memory cell. Therefore, even when a program pulse is applied to the word line, the threshold voltage of the corresponding memory cell would not increase any more.

As such, according to an exemplary embodiment, the operations of changing the value of bit line sense latch 1314 in response to second verify voltage VR2 may be performed individually on each of the memory cells that are to be programmed to second target program state P2. Determining whether the memory cells that are to be programmed to second target program state P2 are indeed completely programmed, which is the verify pass/fail determination, may be performed by current sensing circuit 160 of FIG. 1 or first and second current sensing circuits 161 and 162 of FIG. 7.

As shown in FIG. 1 according to an exemplary embodiment of the present disclosure, current sensing circuit 160 may perform operations to determine the verify pass or fail. The verify pass or fail is determined by comparing (1) the reference voltage based on a reference current corresponding to the number of memory cells to be programmed to second target program state P2 with (2) sensing voltage VPB based on a sensing current corresponding to the number of memory cells having greater threshold voltages than the second verify voltage VR2, among the memory cells to be programmed to the second target program state P2. In other words, the current sensing circuit 160 can determine the verify pass or fail for second target program state P2 by comparing the reference voltage with sensing voltage VPB determined by the number of memory cells coupled to bit line sense latch BSLAT storing the value of "1", among the memory cells to be programmed to second target program state P2.

In the example of FIG. 7, first current sensing circuit 161 may determine verify pass or fail by comparing a reference voltage corresponding to the number of memory cells to be programmed to second target program state P2, among the memory cells included in the selected physical page of memory block BLK_ia, with first sensing voltage VPB1 corresponding to the number of memory cells having greater threshold voltages than second verify voltage VR2, among the memory cells to be programmed to second target program state P2. Second current sensing circuit 162 may determine verify pass or fail by comparing a reference voltage corresponding to the number of memory cells to be programmed to second target program state P2, among the memory cells included in the selected physical page of memory block BLK_ib, with second sensing voltage VPB2 corresponding to the number of memory cells having greater threshold voltages than second verify voltage VR2, among the memory cells to be programmed to second target program state P2.

As described above, the current sensing circuit may determine verify pass/fail for a predetermined target program state (e.g., P2). Hereinafter, throughout the present disclosure, an operation of determining verify/pass fail for a predetermined target program state, among a plurality of target program states, is referred to as an "individual state CSC operation." In the individual state CSC operation, it can be determined whether memory cells to be programmed to a predetermined target program state are completely programmed.

In contrast, an operation of determining verify/pass for all target program states P1 to P7 is referred to as an "all-state CSC operation." In the all-state CSC operation, it may be determined whether the entire program operation is completed or not by comparing a reference voltage corresponding to the number of memory cells included in a selected physical page with the number of completely programmed memory cells, among the memory cells included in the selected physical page. In other words, in the all-state CSC operation, current sensing circuit 160 may determine verify pass or fail for second target program state P2 by comparing the reference voltage with sensing voltage VPB determined by the number of memory cells coupled to bit line sense latch BSLAT storing the value of "1", among all memory cells included in the selected physical page.

FIG. 8 illustrates target program states of triple-level cells for illustrative purposes. The plurality of memory cells included in the semiconductor memory device according to an exemplary embodiment of the present disclosure may be multi-level cells (MLCs). In another exemplary embodiment, the plurality of memory cells included in the semiconductor memory device may be quad-level cells.

FIGS. 9A and 9B are diagrams illustrating a program operation based on an individual state CSC operation.

Referring to FIGS. 9A and 9B, a program operation may be performed on a first plane and a second plane at the same time. The program operation shown in FIGS. 9A and 9B may include a total of 19 program loops. More specifically, FIG. 9A illustrates first to tenth program loops performed on the first and second planes, and FIG. 9B illustrates eleventh to nineteenth program loops performed on the first and second planes. In FIG. 9A, the program operation on the first and second planes may proceed up to points A1 and A2, and in FIG. 9B, the program operation on the first and second planes may proceed from points A1 and A2.

First program pulse VP1 can be applied to a selected word line in the first program loop. First verify voltage VR1 may be applied to the selected word line for a verify operation. Only first verify voltage VR1 may be applied in the first program loop since a memory cell programmed to second target program state P2 or a greater program state is highly unlikely to exist as a result of the first program loop. After first verify voltage VR1 is applied, the value of bit line sense latch 1314 of the page buffer coupled to a memory cell having a threshold voltage greater than first verify voltage VR1, among the memory cells to be programmed to first target program state P1, may be changed to "1." The value of bit line sense latch 1314 of the page buffer coupled to a memory cell having a threshold voltage lower than first verify voltage VR1, among the memory cells to be programmed to first target program state P1, may be maintained at "1."

After the first verify voltage VR1 is applied, an individual state CSC operation for first target program state P1 may be performed. Since only some of the memory cells to be programmed to first target program state P1 can have been completely programmed, the individual state CSC operation in the first program loop may fail in both first and second planes (CSC1-Fail).

Subsequently, a second program loop may be performed. Second program pulse VP2 may be applied to a selected word line and first and second verify voltages VR1 and VR2 may be applied to the selected word line. As first verify voltage VR1 and second verify voltage VR2 are applied, the value of bit line sense latch 1314 of a page buffer coupled to a completely programmed memory cell, among memory cells to be programmed to first and second target program states P1 and P2, may be changed to "1." The value of bit line sense latch 1314 of a page buffer coupled to a memory cell which is not completely programmed, among the memory cells programmed to first and second target program states P1 and P2, may be maintained at "0."

A verify voltage applied in each program loop may be appropriately selected. For example, although in the exemplary embodiment of FIGS. 9A and 9B, second verify voltage VR2 may start to be applied in the second program loop, second verify voltage VR2 may start to be applied from the first program loop, or the second verify voltage VR2 may start to be applied from a third program loop.

The individual state CSC operation for first target program state P1 may be performed again in the second program loop. In the exemplary embodiment of FIGS. 9A and 9B, the program operation for first target program state P1 might not be completed even in the second program loop. Therefore, the individual state CSC operation in the second program loop may fail in both first and second planes (CSC1-Fail).

Subsequently, the third program loop may be performed. Third program pulse VP3 may be applied to a selected word line and first to third verify voltages VR1 to VR3 may be applied to the selected word line. As first to third verify voltages VR1 to VR3 are applied, the value of bit line sense latch 1314 of a page buffer coupled to a completely programmed memory cell, among memory cells to be programmed to first to third target program states P1 to P3, may be changed to "1." The value of bit line sense latch 1314 of a page buffer coupled to a memory cell which is not completely programmed, among the memory cells programmed to the first to third target program states P1 to P3, can be maintained at "0."

The individual state CSC operation for first target program state P1 may be performed again in the third program loop. In the exemplary embodiment of FIGS. 9A and 9B, the program operation on the first and second planes for first target program state P1 may be completed in the third program loop. Therefore, the individual state CSC operation may pass in both first and second planes (CSC1-Pass).

Subsequently, a fourth program loop may be performed. Fourth program pulse VP4 may be applied to a selected word line and second to fourth verify voltages VR2 to VR4 may be applied to the selected word line. Since the individual state CSC operation for first target program state P1 has passed, first verify voltage VR1 might not be applied. As second to fourth verify voltages VR2 to VR4 are applied, the value of bit line sense latch 1314 of a page buffer coupled to a completely programmed memory cell, among memory cells to be programmed to second to fourth target program states P2 to P4, may be changed to "1." The value of bit line sense latch 1314 of a page buffer coupled to a memory cell which is not completely programmed, among the memory cells programmed to second to fourth target program states P2 to P4, may be maintained at "0."

Since the individual state CSC operation for first target program state P1 has passed in the third program loop, an individual state CSC operation for second target program state P2 may be performed in the fourth program loop. In the exemplary embodiment of FIGS. 9A and 9B, the program operation for second target program state P2 might not be completed in the fourth program loop. Therefore, the individual state CSC operation in the fourth program loop may fail in both first and second planes (CSC2-Fail).

Subsequently, in a fifth program loop, the individual state CSC operation for second target program state P2 may pass (CSC2_Pass). The above-described program loops may be repeated. Repetitive explanations of the sixth to fourteenth program loops will be omitted.

In the fifteenth program loop, an individual state CSC operation on the first plane for sixth target program state P6 may fail (CSC6_Fail). On the other hand, the individual state CSC operation on the second plane for sixth target program state P6 may pass (CSC6_Pass). Such pass/fail inconsistency may occur when the first plane includes more slow cells. When some of the memory cells corresponding to sixth target program state P6, among the memory cells of the first plane, are slow cells, the individual state CSC operation for sixth target program state P6 may be repeated. In the exemplary embodiment of FIGS. 9A and 9B, the individual state CSC operation on the first plane for sixth target program state P6 may be repeated up to an eighteenth program loop. Therefore, in the second plane, the individual state CSC operation on the second plane for sixth target program state P6 may pass, and an individual state CSC operation for seventh target program state P7 might not be performed. Therefore, after the individual state CSC operation on the first plane for sixth target program state P6 has passed, an individual state CSC operation for seventh target program state P7 in the nineteenth program loop may be performed.

A program operation of the memory cells included in the second plane may be completed in a seventeenth or eighteenth program loop. However, since the individual state CSC operation for the seventh target program state is not performed, whether the program operation has not been completed might not be checked. Therefore, when an individual state CSC operation for a predetermined target program state (e.g., P6) is repeatedly performed on the first plane including a slow cell, although the second plane has been completely programmed, an unnecessary program pulse can be applied to a word line since it is impossible to check the program completion.

According to a semiconductor memory device and an operating method thereof according to an exemplary embodiment of the present invention, when a predetermined condition is satisfied, a verify operation for all target program states, not a verify operation for an individual target program state, may be performed. For example, when a program loop has proceeded a predetermined critical number of times, or when verification for a predetermined target program state is completed, an all-state CSC operation instead of an individual state CSC operation may be performed. Therefore, even when program is not normally performed due to a slow cell in one of the plurality of planes, whether verify pass or fail of another normal plane may be checked. When the verify pass of the normal plane is checked, a word line of the corresponding plane may be floated so as not to apply an additional program pulse. Therefore, disturbance which may occur when an unnecessary program pulse is applied may be prevented.

Figure 10:
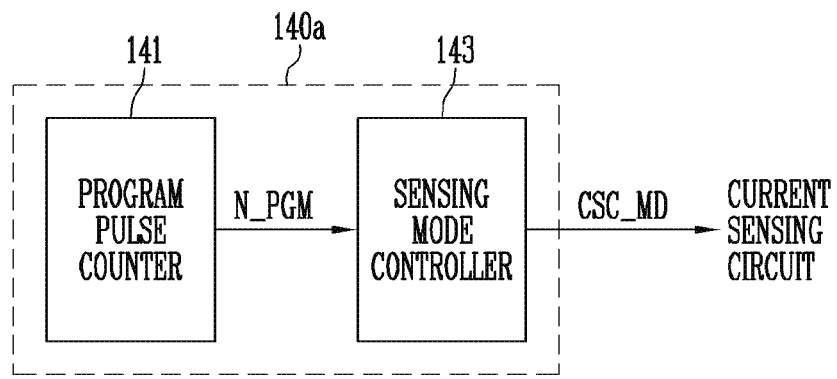
FIG. 10 is a block diagram illustrating a control logic 140a according to an exemplary embodiment of the present disclosure.

FIG. 10 is a block diagram illustrating control logic 140*a* according to an exemplary embodiment of the present disclosure.

Referring to FIG. 10, control logic 140*a* according to an exemplary embodiment of the present disclosure may include program pulse counter 141 and sensing mode controller 143. Program pulse counter 141 may count program pulses applied to a selected word line during a program operation to update program pulse count value N_PGM. In other words, program pulse count value N_PGM may be updated whenever a program loop is performed. In this manner, the number of program loops performed may be determined. Program pulse counter 141 may transfer program pulse count value N_PGM to sensing mode controller 143. Sensing mode controller 143 may generate current sensing mode signal CSC_MD based upon program pulse count value N_PGM. More specifically, sensing mode controller 143 may compare received program pulse count value N_PGM with a predetermined critical count value to generate current sensing mode signal CSC_MD. Sensing mode controller 143 may include a storage unit such as a register storing a critical count value.

When program pulse count value N_PGM is smaller than the critical count value, sensing mode controller 143 may generate and transfer current sensing mode signal CSC_MD for performing an individual state CSC operation to current sensing circuit 160. When program pulse count value N_PGM is greater than or equal to the critical count value, sensing mode controller 143 may generate and transfer current sensing mode signal CSC_MD for performing an all-state CSC operation to current sensing circuit 160.

Generated current sensing mode signal CSC_MD may be transferred to current sensing circuit 160. More specifically, current sensing mode signal CSC_MD may be transferred to current sensing circuits 161 and 162 shown in FIG. 7. Current sensing circuits 161 and 162 may perform the individual state CSC operation or the all-state CSC operation based upon current sensing mode signal CSC_MD.

Figure 11:
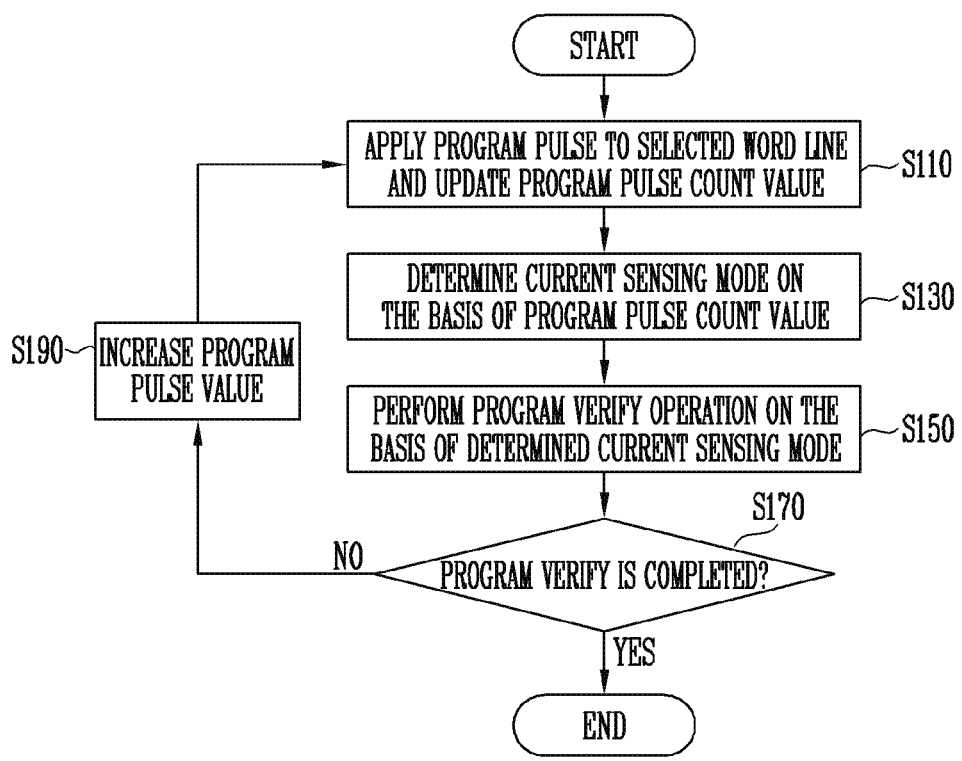
FIG. 11 is a flowchart illustrating a method of operating a semiconductor memory device according to an exemplary embodiment of the present disclosure.

FIG. 11 is a flowchart illustrating a method of operating a semiconductor memory device according to an exemplary embodiment of the present disclosure.

Referring to FIG. 11, a method of operating a semiconductor memory device may include applying a program pulse to a selected word line and updating program pulse count value N_PGM (S110), determining a current sensing mode based upon program pulse count value N_PGM (S130), performing a program verify operation based upon the determined current sensing mode (S150), and determining whether program verify is completed (S170). The method of the semiconductor memory device may further include increasing a program pulse value when the program verify is not completed (S190).

At step S110, the program pulse may be applied to the selected word line to perform a program operation to increase threshold voltages of memory cells coupled to a bit line to which a program permission voltage is applied. After the program pulse is applied, program pulse count value N_PGM may be updated. This will be performed by program pulse counter 141 of FIG. 10.

At step S130, whether to perform an individual state CSC operation or an all-state CSC operation may be determined based upon the updated program pulse count value. At step S150, a current sensing circuit can perform a program verify operation based upon the determined current sensing mode. In other words, according to a result of determination at step S130, the current sensing circuit may perform at least one of the individual state CSC operation and the all-state CSC operation.

At step S170, whether the entire program operation has been completed or not may be determined. In other words, at step S170, whether the entire program operation for first to seventh target program states P1 to P7 has been completed may be determined. After program verify as the result of determination at step S170 is completed, the entire program operation may be terminated.

The steps S110, S130, S150, and S170 shown in FIG. 11 may constitute a single program loop. When the program verify is not completed as the result of determination at step S170, after a program pulse value is increased at step S190, a subsequent program loop may be performed.

FIG. 12 is a detailed flowchart illustrating a method of operating the semiconductor memory device shown in FIG. 11. Steps S110, S170, and S190 of FIG. 12 may be the same as those of FIG. 11. Therefore, repetitive explanations will be omitted.

At step S131, as a new program loop starts, the updated pulse count value may be compared with the critical count value. The critical count value may be appropriately determined according to experiments or simulations. At step S133, it may be determined whether the program pulse count value is greater than or equal to the critical count value.

When the program pulse count value is smaller than the critical count value, a current sensing operation for an individual target program state may be performed (S151). In other words, the individual state CSC operation may be performed at step S151.

When the program pulse count value is greater than or equal to the critical count value, a current sensing operation on all target program states may be performed (S153). In other words, an all-state CSC operation may be performed at step S153.

After the current sensing operation on the individual target program state or the current sensing operation on all target program states is performed, it may be determined whether program verify is completed (S170).

Figure 13A:
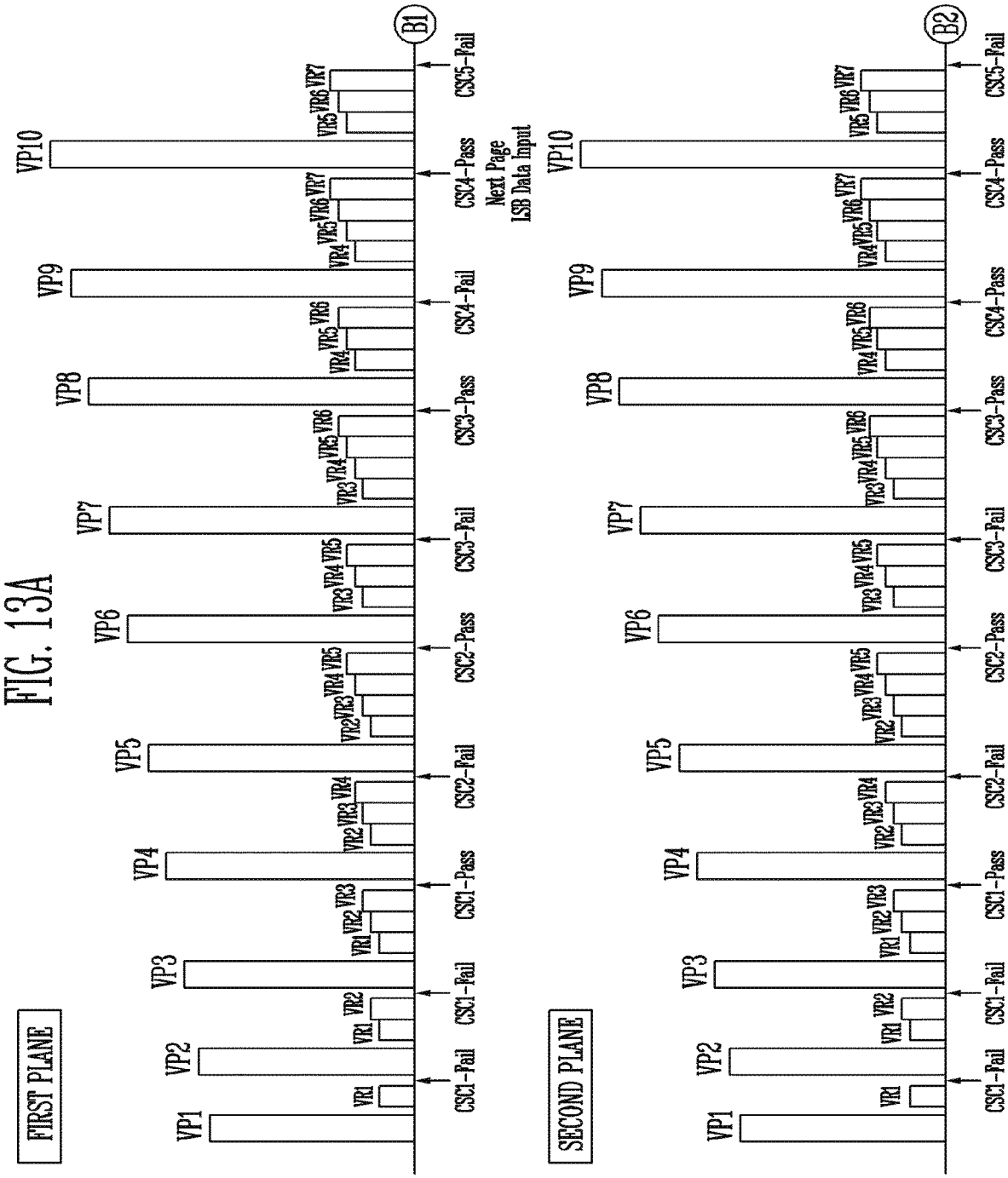

FIGS. 13A and 13B are diagrams illustrating a program operation according to the exemplary embodiment shown in FIG. 12. In FIG. 13A, a program operation on the first and second planes may proceed up to points B1 and B2, and in FIG. 13B, a program operation on the first and second planes may start from points B1 and B2.

In an exemplary embodiment of FIGS. 13A and 13B, the critical count value considered at step S131 of FIG. 12 may be "15." Therefore, when a program pulse count value is 1 to 14, control logic 140a may control current sensing circuits 161 and 162 to perform an individual state CSC operation. A detailed description of operations from first to fourteenth program loops which are the same as described with reference to FIGS. 9A and 9B will be omitted.

In the fifteenth program loop, program pulse VP15 and verify voltages VR6 and VR7 may be applied to selected word lines of the first and second planes. Since the updated program pulse count value is 15 and the critical count value is also 15, the process flow may proceed to step S153 in FIG. 12 to perform a current sensing operation for all target program states. Since the entire program operation on the first and second planes is not completed in the fifteenth program loop, the all-state CSC operation may fail (ALL CSC-Fail).

In the sixteenth program loop, program pulse VP16 and verify voltages VR6 and VR7 may be applied to selected word lines of the first and second planes. Since the updated program pulse count value is 16 and the critical count value is 15, the process flow may proceed to step S153 in FIG. 12 to perform a current sensing operation on all target program states. Since the entire program operation on the first and second planes is not completed in the sixteenth program loop, the all-state CSC operation may fail (ALL CSC-Fail).

In the seventeenth program loop, program pulse VP17 and verify voltages VR6 and VR7 may be applied to selected word lines of the first and second planes. Since the updated program pulse count value is 17 and the critical count value is 15, a current sensing operation on all target program states may be performed. Since the entire program operation on the first plane is not completed in the seventeenth program loop, the all-state CSC operation may fail (ALL CSC-Fail). Since the first plane includes more slow cells, the all-state CSC operation may fail in eighteenth and nineteenth program loops.

Since the entire program operation on the second plane is not completed in the seventeenth program loop, the all-state CSC operation may fail (ALL CSC-Fail). When the entire program operation on the second plane is completed, a local word line on the second plane may be floated. Therefore, even when a subsequent program loop is performed, a program pulse might not be applied to the selected word line of the second plane.

Referring to FIGS. 13A and 13B, according to a semiconductor memory device and an operating method thereof, a verify process may be carried out by performing a current sensing operation for all target program states after a program loop is performed a predetermined number of times. Therefore, even when more slow cells are distributed in a predetermined plane and a program loop on the corresponding plane is repeated, whether a plane on which a program operation is completed is completely programmed or not may be determined. Accordingly, a disturbance phenomenon occurring when an unnecessary program pulse is applied to a local word line of a completely programmed plane may be prevented by floating the local word line.

Figure 14:
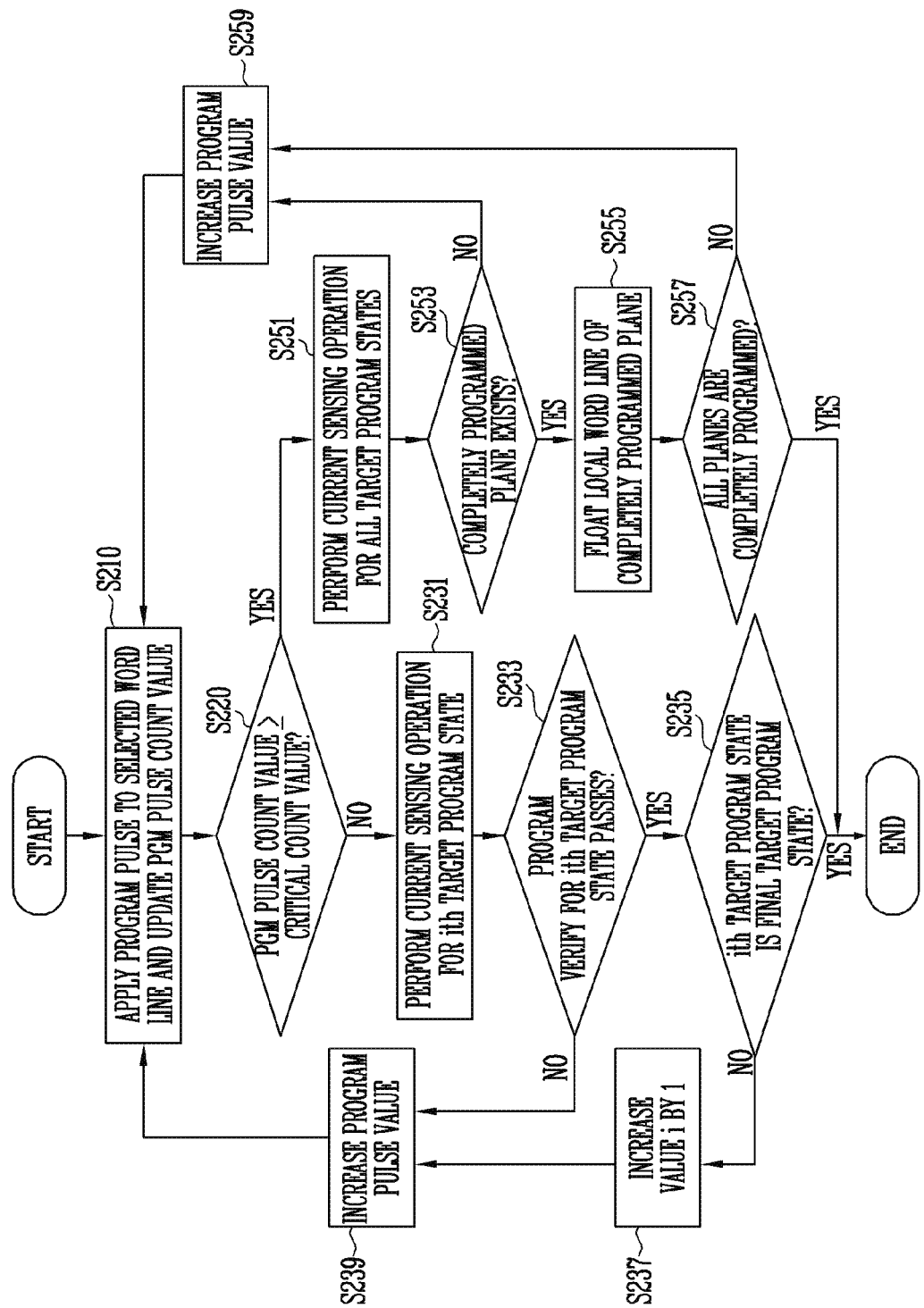
FIG. 14 is a detailed flowchart illustrating a method of operating a semiconductor memory device shown in FIG. 12.

FIG. 14 is a detailed flowchart illustrating a method of operating semiconductor memory device 100 shown in FIG. 12. First, at step S210, a program pulse may be applied to a selected word line and a program pulse count value may be updated. At step S220, the program pulse count value may be compared with a critical count value. When the program pulse count value is smaller than the critical count value, a current sensing operation for an ith target program state may be performed (S231). In other words, at step S231, an individual state CSC operation for the ith target program state may be performed. At the beginning of a program operation, i.e., in a first program loop, a value i may be 1 (one).

At step S233, program verify pass/fail for the ith target program state may be determined. When verify fail is determined at step S233, a program pulse value may be increased (S239). The process flow may then proceed to step S210, so that a subsequent program loop may be performed. However, an index value of a target program state for an individual state CSC operation, i.e., the value i might not be changed.

When verify pass is determined at step S233, it may be determined whether the ith target program state is the final target program state (S235). When the ith target program state is determined as the final target program state, since the entire program verify passes, the program operation may be terminated. On the other hand, when the ith target program state is not the final target program state, the process flow may procced to step S237 to increase the value i. Therefore, in a subsequent program loop, an individual state CSC operation for the next target program state may be performed. After step S237, the process flow may proceed to step S239 to increase the program pulse value, and a subsequent program loop may be repeated.

As a result of determination at step S220, when the program pulse count value is greater than or equal to the critical count value, a current sensing operation for all target program states, i.e., an all-state CSC operation may be performed (S251). At step S253, it may be determined whether a completely programmed plane exists. When the completely programmed plane is not present, the program pulse value may be increased (S259) and a subsequent program loop may be performed.

As a result of determination at step S253, when the completely programmed plane exists, a local word line of the completely programmed plane may be floated (S255). Since the second plane is completely programmed in the seventeenth program loop of FIG. 13B, the local word line of the second plane may be floated.

Subsequently, at step S257, it may be determined whether all planes are completely programmed (S257). When all planes are completely programmed, the program operation may be terminated. When a plane which is not completely programmed is present, the program pulse value may be increased (S259) and a subsequent program loop may be performed. Referring to FIGS. 13A, 13B, and 14, the program operation described with reference to FIGS. 13A and 13B may be performed according to the flowchart of FIG. 14.

Referring to FIGS. 13A and 13B, the individual state CSC operation for fourth target program state P4 in the ninth program loop may pass. For example, when bit codes corresponding to fifth to seventh target program states P5 to P7 have the same LSB data, i.e., when bit codes corresponding to fifth to seventh target program states P5 to P7 have different CSB and MSB data, the data of data latch 1313 storing LSB data as shown in FIG. 6 may be unnecessary in a subsequent program operation, i.e., a program operation of memory cells corresponding to fifth to seventh target program states P5 to P7. Therefore, LSB data corresponding to a next physical page may be stored beforehand in data latch 1313. In the above example, when the individual state CSC operation corresponding to fourth target program state P4 passes, LSB data of the next page may be input to data latch 1313 of the page buffer.

In the same manner, when the bit codes corresponding to sixth and seventh target program states P6 and P7 have the same LSB data and CSB data, i.e., when the bit codes corresponding to sixth and seventh target program states P6 and P7 have different MSB data, if the individual state CSC operation corresponding to fifth target program state P5 is completed, CSB data stored in data latch 1312 in a subsequent program operation may be unnecessary. In the exemplary embodiment of FIGS. 13A and 13B, CSB data of the next physical page may be input after the eleventh program loop is performed.

In the above-described exemplary embodiment, when the individual state CSC operation corresponding to sixth target program state P6 is completed, the MSB data stored in data latch 1311 may be unnecessary in a subsequent program operation. However, as shown in FIGS. 13A and 13B, when the operation switches to the all-state CSC operation before the individual state CSC operation for sixth target program state P6 passes, whether sixth target program state P6 is completely programmed might not be identified. Therefore, MSB data for the next physical page might not be input in advance.

Therefore, according to an exemplary embodiment of the present disclosure, when the number of times a program loop is performed reaches a predetermined critical count value, a current sensing operation for all target program states and a current sensing operation for an individual target program state may be performed in parallel. Therefore, when a slow cell exists in a predetermined plane, whether another plane is completely programmed or not may be determined. In addition, by checking whether an individual state CSC operation passes, LSB data, CSB data and MSB data of a next page may be input beforehand to data latches 1311, 1312, and 1313 of the page buffer 131. This exemplary embodiment will be described below with reference to FIGS. 15 and 16.

Figure 15:
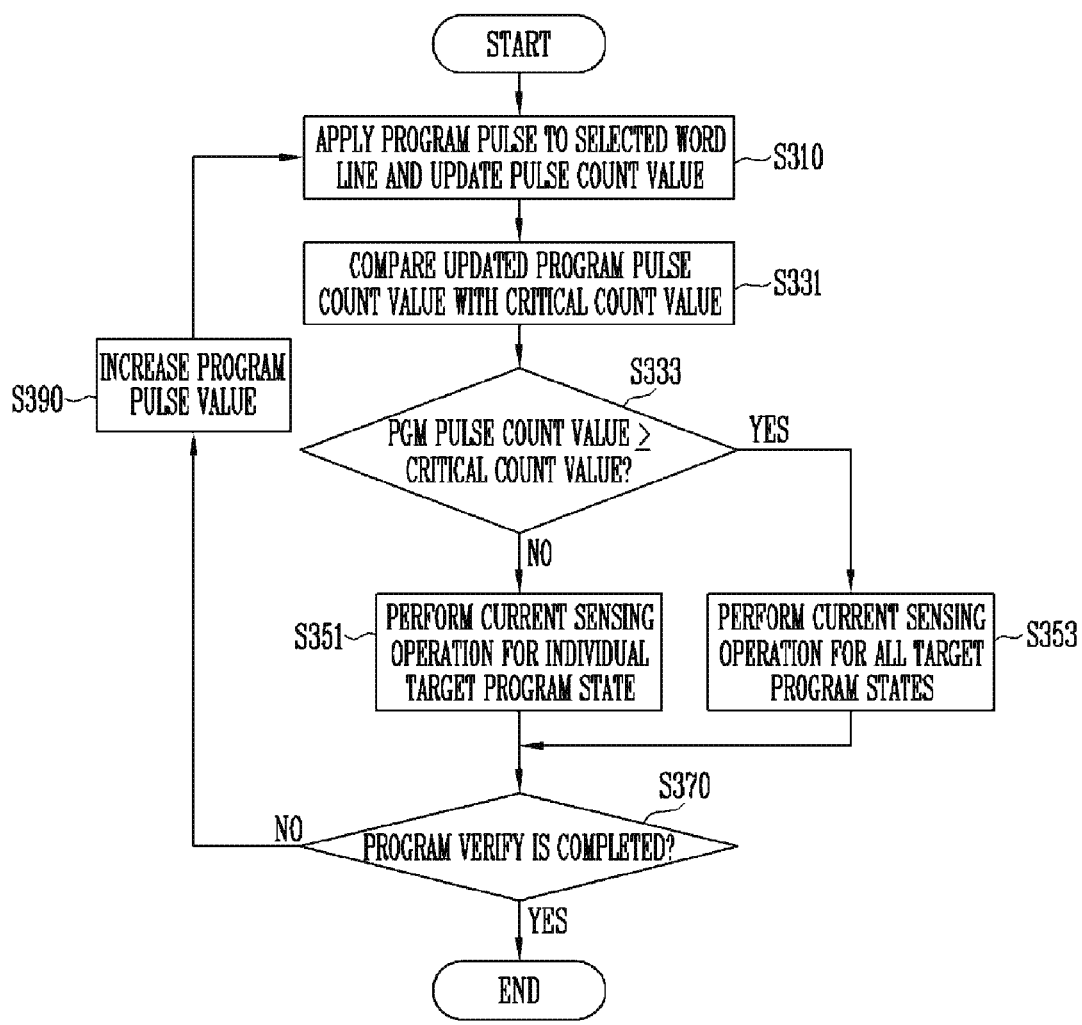
FIG. 15 is a flowchart illustrating a method of operating a semiconductor memory device according to an exemplary embodiment of the present disclosure.

FIG. 15 is a flowchart illustrating a method of operating the semiconductor memory device 100 according to an exemplary embodiment of the present disclosure. The steps (S310, S331, S333, S351, S353, S370, and S390) of FIG. 15 may be substantially the same as the steps (S110, S131, S133, S151, S153, S170, and S190) of FIG. 12. However, in FIGS. 13A and 13B, as the result of determination at step S133, when the program pulse count value is greater than or equal to the critical count value, only a current sensing operation for all target program states may be performed. On the other hand, when it is determined at step S333 that the program pulse count value is greater than or equal to the critical count value, a current sensing operation on all target program states may be first performed and a current sensing operation for an individual target program state may then be performed.

According to the exemplary embodiment of FIG. 15, when the program pulse count value is smaller than the critical count value, only an individual state CSC operation (S351) may be performed. On the other hand, when the program pulse count value is greater than or equal to the critical count value, both an all-state CSC operation S353 and the individual state CSC operation S351 may be performed.

Figure 16A:
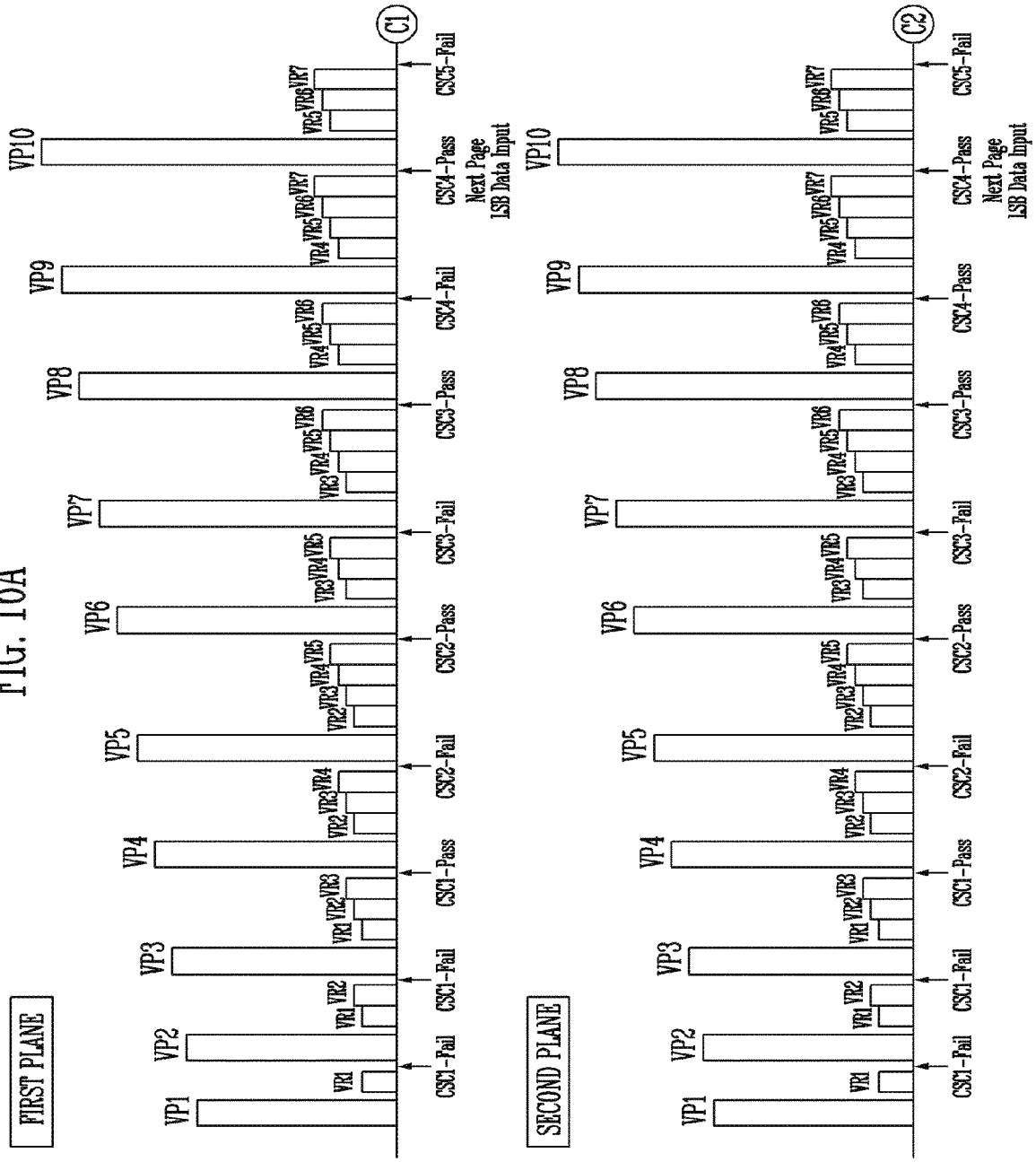

FIGS. 16A and 16B are diagrams illustrating a program operation according to the exemplary embodiment illustrated in FIG. 15. In FIG. 16A, a program operation on the first and second planes may proceed up to points C1 and C2, and in FIG. 16B, a program operation on the first and second planes may proceed from points C1 and C2.

In an exemplary embodiment of FIGS. 16A and 16B, a critical count value considered at step S331 of FIG. 15 may be "15."

Therefore, when a program pulse count value is 1 to 14, control logic 140a may control current sensing circuits 161 and 162 to perform an individual state CSC operation. Repetitive explanations of operations from the first to fourteenth program loops which are the same as described with reference to FIGS. 9A, 9B, 13A, and 13B will be omitted.

In the fifteenth program loop, program pulse VP15 and verify voltages VR6 and VR7 may be applied to a selected word line of the first and second planes. Since the updated program pulse count value is 15 and the critical count value is also 15, the process flow may proceed to step S353 in FIG. 12 to perform a current sensing operation for all target program states and a current sensing operation on an individual target program state. Since the entire program operation on the first and second planes is not completed in the fifteenth program loop, the all-state CSC operation may fail (ALL CSC-Fail).

In the seventeenth program loop, program verify for the second plane may be completed to float a local word line.

The individual state CSC operation for sixth target program state P6 may pass in the eighteenth program loop. Therefore, MBS data of the next page may be input after the eighteenth program loop is performed.

Referring to FIGS. 13A, 13B, 16A, and 16B, MBS data of the next page might not be input since only an all-state CSC operation is performed from the fifteenth program loop in the case of FIGS. 13A and 13B, whereas both the all-state CSC operation and the individual state CSC operation may be performed in the case of FIGS. 16A and 16B, and the MBS data of the next page may be input after the individual state CSC operation for the sixth target program state P6 passes.

Figure 17:
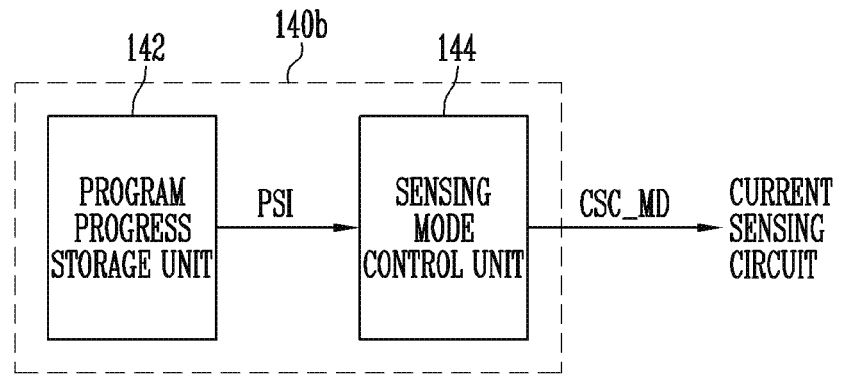
FIG. 17 is a block diagram illustrating a control logic 140b according to another exemplary embodiment of the present disclosure.

FIG. 17 is a block diagram illustrating control logic 140b according to another exemplary embodiment of the present disclosure.

Referring to FIG. 17, the control logic 140b according to an exemplary embodiment of the present disclosure may include program progress storage unit 142 and sensing mode control unit 144. Program progress storage unit 142 may generate index value PSI of a target program state for which verification is being performed based upon the completed program state. For example, when verify pass of first to third target program states P1 to P3, among first to seventh target program states P1 to P7, is determined, index value PSI for target program state P4 for which verification is being performed may be four. Sensing mode control unit 144 may generate current sensing mode signal CSC_MD based upon received index value PSI. More specifically, sensing mode control unit 144 may compare received index value PSI with a predetermined critical index value to generate current sensing mode control signal CSC_MD. Sensing mode control unit 144 may include a storage unit such as a register storing the critical index value.

When index value PSI is smaller than the critical index value, sensing mode control unit 144 may generate and transfer current sensing mode signal CSC_MD for performing the individual state CSC operation to the current sensing circuit. When index value PSI is greater than or equal to the critical index value, sensing mode control unit 144 may generate and transfer current sensing mode signal CSC_MD for performing the all-state CSC operation to current sensing circuit 160.

Figure 18:
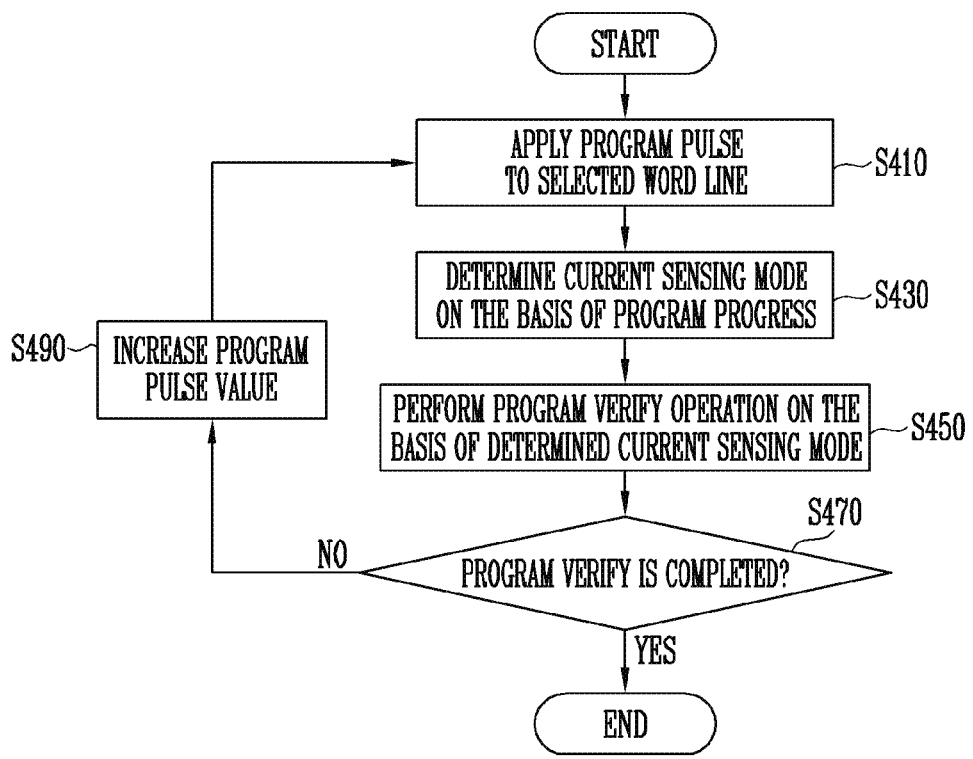
FIG. 18 is a flowchart illustrating a method of operating a semiconductor memory device according to an exemplary embodiment of the present disclosure.

FIG. 18 is a flowchart illustrating a method of operating a semiconductor memory device according to an exemplary embodiment of the present disclosure.

Referring to FIG. 18, a method of operating a semiconductor memory device may include applying a program pulse to a selected word line (S410), determining a current sensing mode based upon a program progress (S430), performing a program verify operation based upon the determined current sensing mode (S450), and determining whether program verify is completed or not (S470). The method of operating the semiconductor memory device may further include increasing a program pulse value when the program verify is not completed (S490).

At step S410, the program pulse may be applied to the selected word line to perform a program operation to increase threshold voltages of memory cells coupled to a bit line to which a program permission voltage is applied.

At step S430, whether to perform an individual state CSC operation or an all-state CSC operation may be determined based upon the current program progress. At step S450, a current sensing circuit may perform a program verify operation based upon the determined current sensing mode. In other words, according to a result of determination at step S430, the current sensing circuit may perform at least one of the individual state CSC operation and the all-state CSC operation.

At step S470, whether the entire program operation has been completed or not may be determined. In other words, at step S470, whether the entire program operation for first to seventh target program states P1 to P7 has been completed may be determined. After program verify is completed as a result of determination at step S470, the program operation may finish.

FIG. 19 is a detailed flowchart illustrating a method of operating semiconductor memory device 100 shown in FIG. 18. Steps S410, S470, and S490 of FIG. 19 may be the same as those of FIG. 11. Therefore, a detailed description thereof will be omitted.

At step S431, index value PSI of the target program state for which verification is being performed may be compared with a critical index value. The critical index value may be appropriately determined according to experiments or simulations. At step S433, it may be determined whether the index value PSI of the current target program state is greater than or equal to the critical index value.

When index value PSI of the current target program state is smaller than the critical index value, a current sensing operation for an individual target program state may be performed (S451). In other words, the individual state CSC operation may be performed at step S451.

When index value PSI of the current target program state is greater than or equal to the critical index value, a current sensing operation for all target program states may be performed (S453). In other words, the all-state CSC operation may be performed at step S453.

After the current sensing operation on the individual target program state or the current sensing operation on all target program states is performed, it may be determined whether program verify is completed (S470).

FIGS. 20A and 20B are diagrams illustrating a program operation according to the exemplary embodiment illustrated in FIG. 12. In FIG. 20A, a program operation on the first and second planes may proceed up to points D1 and D2, and in FIG. 20B, a program operation on the first and second planes may proceed from points D1 and D2.

In an exemplary embodiment of FIGS. 20A and 20B, a critical index value considered at step S431 of FIG. 19 may be "6."

Therefore, when a target program state for which verification is being performed is first to fifth states P1 to P5, control logic 140b may control the current sensing circuits 161 and 162 to perform an individual state CSC operation.

Repetitive explanations of operations from the first to eleventh program loops which are the same as described with reference to FIGS. 9A and 9B will be omitted.

The individual state CSC operation for fifth target program state P5 may pass in the eleventh program loop. Therefore, verification for sixth target program state P6 may start from the twelfth program loop. Therefore, since index value PSI is six and the critical index value is also six as the twelfth program loop starts, a current sensing operation for all target program states may be performed from the twelfth program loop.

Referring to FIGS. 20A and 20B, according to a semiconductor memory device and an operating method thereof, a verify process may be carried out by performing a current sensing operation for all target program states after verification for a predetermined state (e.g., P6) starts. Therefore, even when a program loop on the corresponding plane is repeated since more slow cells are distributed in a predetermined plane, it may determine whether a plane on which a program operation is completed is completely programmed. Accordingly, a disturbance phenomenon occurring when an unnecessary program pulse is applied to a local word line of the completely programmed plane may be prevented by floating the local word line.

Figure 21:
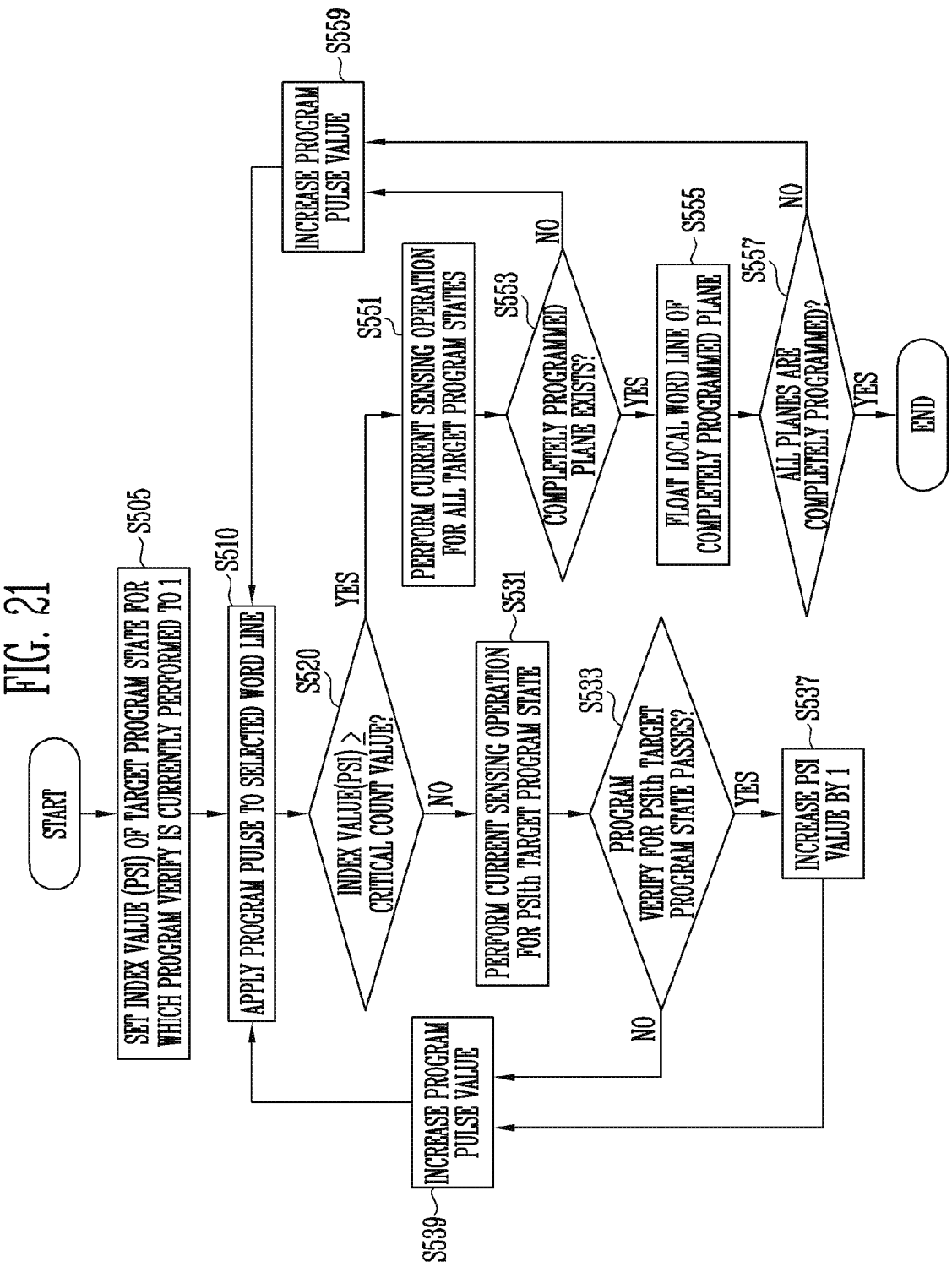
FIG. 21 is a detailed flowchart illustrating a method of operating a semiconductor memory device shown in FIG. 19.

FIG. 21 is a detailed flowchart illustrating a method of operating semiconductor memory device 100 shown in FIG. 19. First, index value PSI of a target program state for which program verify is being performed may be set to one. At step S510, a program pulse may be applied to a selected word line. At step S520, index value PSI of the target program state for which verification is currently performed may be compared with a critical index value. When index value PSI of the current target program state for which verification is being performed is smaller than the critical index value, a current sensing operation for an individual target program state for which verification is being performed may be performed (S531). In other words, at step S531, an individual state CSC operation for a PSI-th target program state may be performed.

At step S533, program verify pass/fail for the PSI-th target program state may be determined. When verify fail is determined at step S533, a program pulse value may be increased (S539). The process flow may then proceed to step S510, and a subsequent program loop may be performed. However, a target program state for an individual state CSC operation, i.e., the PSI value might not be changed.

When verify pass is determined at step S533, the index value PSI may be increased by one (S537), and the process flow may proceed to step S539 to increase the program pulse value. A subsequent program loop may be performed.

As a result of determination at step S520, when index value PSI of the target program state for which verification is currently performed is greater than or equal to the critical index value, a current sensing operation for all target program states, i.e., an all-state CSC operation may be performed (S551). At step S553, it may be determined whether a completely programmed plane exists. When the completely programmed plane is not present, the program pulse value may be increased (S559) and a subsequent program loop may be performed.

As a result of determination at step S553, when the completely programmed plane exists, a local word line of the completely programmed plane may be floated (S555).

Subsequently, at step S557, it may be determined whether all planes are completely programmed or not (S557). When all planes are completely programmed, a program operation may be terminated. When a plane which is not completely programmed is present, the program pulse value may be increased (S559) and a subsequent program loop may be performed. Referring to FIGS. 20A, 20B, and 21, the program operation described with reference to FIGS. 20A and 20B may be performed according to the flowchart of FIG. 21.

Figure 22:
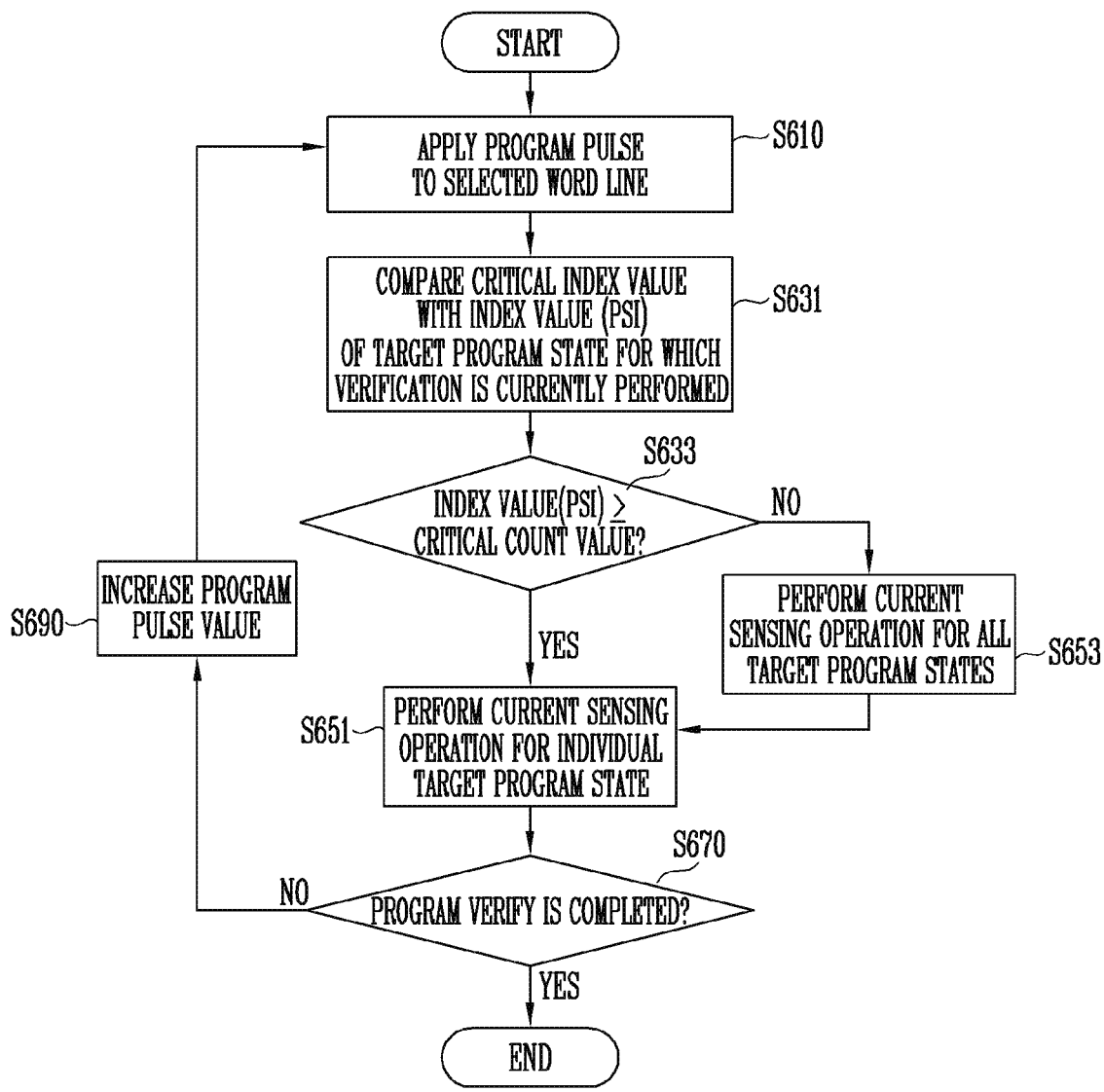
FIG. 22 is a flowchart illustrating a method of operating a semiconductor memory device according to an exemplary embodiment of the present disclosure.

FIG. 22 is a flowchart illustrating a method of operating a semiconductor memory device according to an exemplary embodiment of the present disclosure. The steps (S610, S631, S633, S651, S653, S670, and S690) of FIG. 22 may be substantially the same as the steps (S410, S431, S433, S451, S453, S470, and S490) of FIG. 19. However, as a result of determination of FIG. 19, when index value PSI of the current target program state is greater than or equal to the critical index value, only the current sensing operation for all target program states may be performed. On the other hand, at a result of determination at step S633, when index value PSI of the current target program state is greater than or equal to the critical index value, a current sensing operation for all target program states may be performed first and a current sensing operation for an individual target program state may then be performed.

According to the exemplary embodiment shown in FIG. 22, only the individual state CSC operation (S651) may be performed when the index value PSI of the target program state for which verification is being performed is smaller than the critical index value. However, both an all-state CSC operation (S653) and the individual target program state (S651) may be performed when the index value PSI of the current target program state is greater than or equal to the critical index value.

Figure 23A:
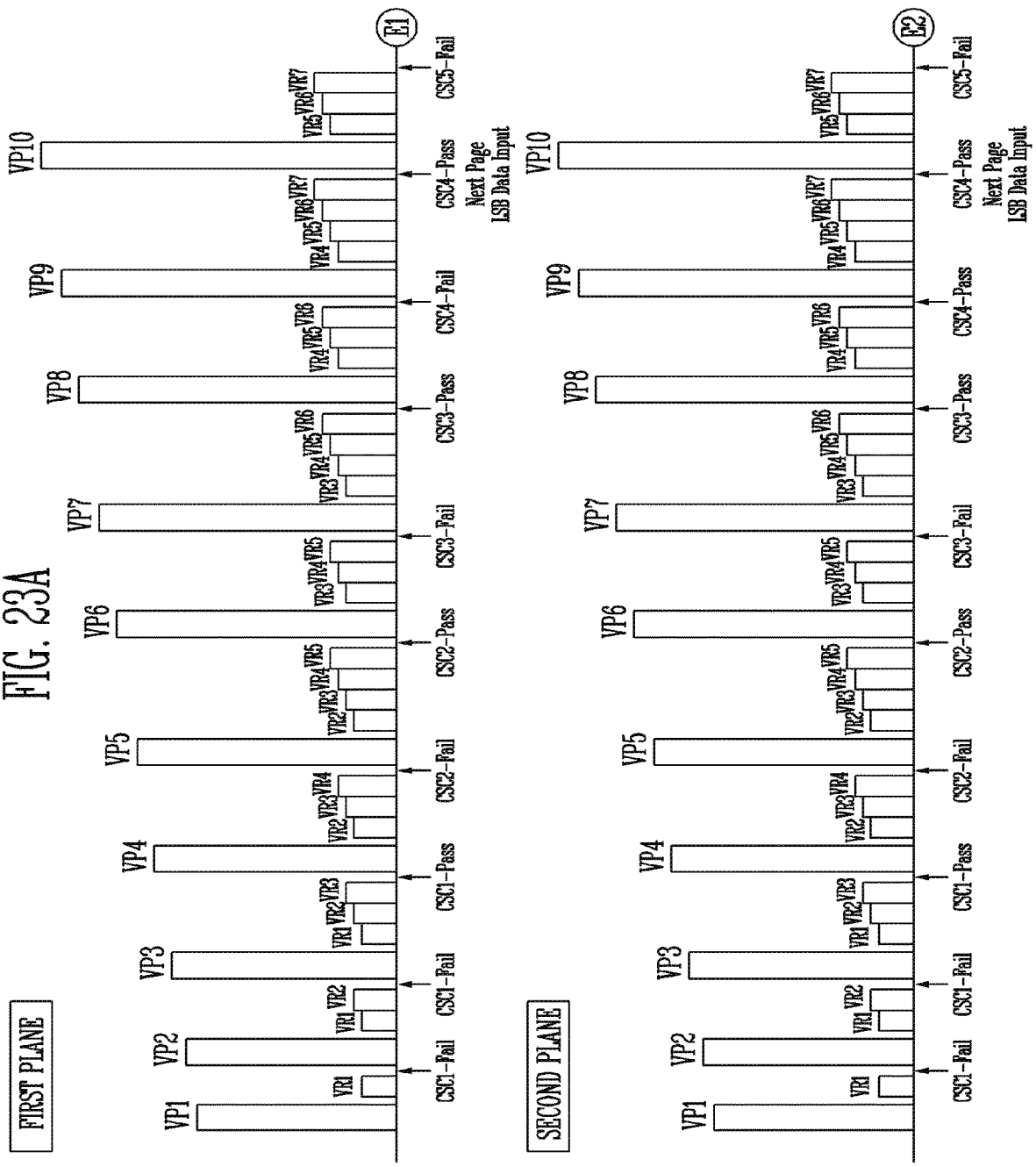

FIGS. 23A and 23B are diagrams illustrating a program operation according to an exemplary embodiment illustrated in FIG. 22. In FIG. 23A, a program operation on the first and second planes may proceed up to points E1 and E2, and in FIG. 23B, a program operation on the first and second planes may proceed from points E1 and E2.

In an exemplary embodiment of FIGS. 23A and 23B, a critical index value considered at step S631 of FIG. 22 is "6."

Therefore, during the first to eleventh program loops in which verification is being performed for first to fifth target program states P1 to P5, control logic 140b may control current sensing circuits 161 and 162 to perform an individual state CSC operation.

In the twelfth program loop, since the target program state for which verification is being performed is sixth target program state P6, index value PSI may be six. Therefore, in FIG. 22, the process flow may proceed to step S653, so that a current sensing operation for all target program states and a current sensing operation for an individual target program state may be performed. In the thirteenth program loop and subsequent program loops, the current sensing operation for all program states and the current sensing operation for an individual target program state may be performed.

In the seventeenth program loop, program verify for the second plane may be completed to float a local word line.

The individual state CSC operation for sixth target program state P6 may pass in the eighteenth program loop. Therefore, MBS data of the next page may be input after the eighteenth program loop is performed.

Referring to FIGS. 20A, 20B, 23A, and 23B, MBS data of the next page might not be input since only an all-state CSC operation is performed from the twelfth program loop in the case of FIGS. 20A and 20B, whereas both the all-state CSC operation and the individual state CSC operation may be performed in the case of FIGS. 23A and 23B, so that the MBS data of the next page may be input after the individual state CSC operation for the sixth target program state P6 passes.

Figure 24:
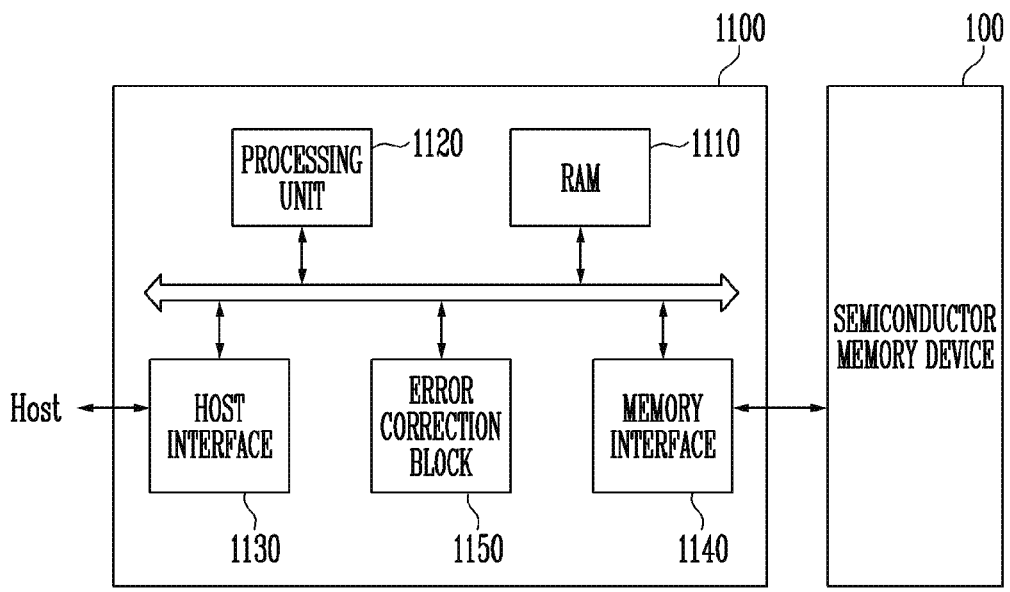
FIG. 24 is a block diagram illustrating an exemplary embodiment (1000) of a memory system including a semiconductor memory device of FIG. 1.

FIG. 24 is a block diagram illustrating an exemplary embodiment (1000) of a memory system 1000 including the semiconductor memory device 100 of FIG. 1.

As illustrated in FIG. 24, the memory system 1000 may include semiconductor memory device 100 and controller 1100. Semiconductor memory device 100 may be semiconductor memory device 100 described with reference to FIG. 1. Hereinafter, repetitive explanations will be omitted.

Controller 1100 may be coupled to a host and semiconductor memory device 100. Controller 1100 may be configured to access semiconductor memory device 100 at the request of the host. For example, Controller 1100 may control a read operation, a program operation, an erase operation, and/or a background operation of semiconductor memory device 100. Controller 1100 may be configured to provide an interface between semiconductor memory device 100 and the host. Controller 1100 may be configured to drive firmware for controlling semiconductor memory device 100.

Controller 1100 may include random access memory (RAM) 1110, processing unit 1120, host interface 1130, memory interface 1140, and error correction block 1150. RAM 1110 may be used as at least one of an operation memory of processing unit 1120, a cache memory between semiconductor memory device 100 and the host, and a buffer memory between semiconductor memory device 100 and the host. Processing unit 1120 may control general operations of controller 1100. In addition, controller 1100 may temporarily store program data provided from the host during a write operation.

Host interface 1130 may interface with the host to perform data exchange between the host and controller 1100. For example, controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

Memory interface 1140 may interface with semiconductor memory device 100. For example, the memory interface includes a NAND interface or a NOR interface.

Error correction block 1150 may detect and correct errors in data received from semiconductor memory device 100 by using an error correction code (ECC). Processing unit 1120 may control the semiconductor memory device 100 to control a read voltage and perform re-read according to an error detection result of error correction block 1150. According to an exemplary embodiment, error correction block 1150 may be provided as one of the components of controller 1100.

Controller 1100 and the semiconductor memory device 100 may be integrated in a single semiconductor device. In an exemplary embodiment, controller 1100 and semiconductor memory device 100 may be integrated into one semiconductor device, to constitute a memory card. For example, controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

Controller 1100 and semiconductor memory device 100 may be integrated into a single semiconductor device to form a solid state drive (SSD). The SSD may include a storage device configured to store data in a semiconductor memory. When memory system 1000 is used as a semiconductor drive (SSD), an operating speed of the host coupled to the memory system 2000 may be significantly increased.

In another example, memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, semiconductor memory device 100 or memory system 1000 may be embedded in packages of various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP), a wafer-level processed stack package (WSP), or the like.

Figure 25:
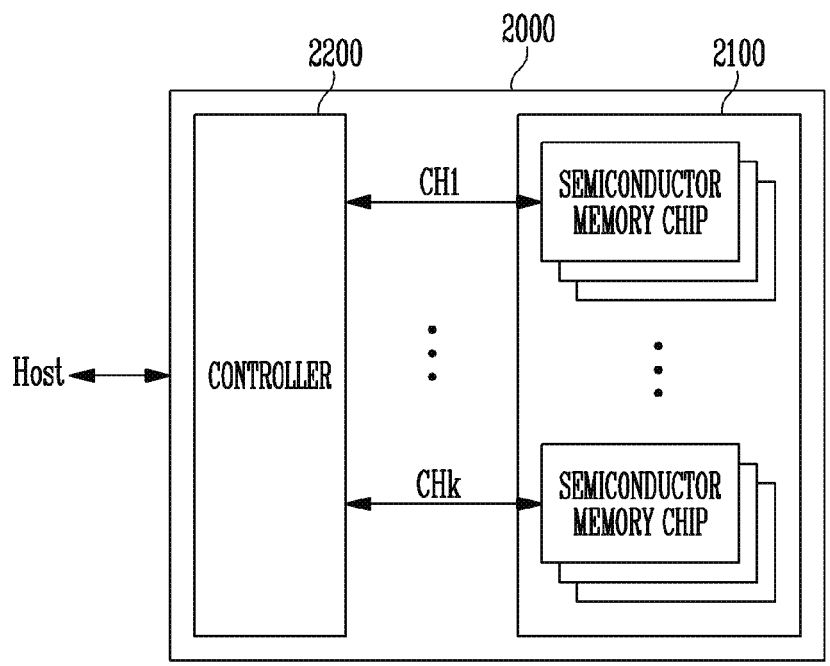
FIG. 25 is a block diagram illustrating an application example of a memory system shown in FIG. 24.

FIG. 25 is a block diagram illustrating an application example (2000) of memory system 1100 shown in FIG. 24.

Referring to FIG. 25, memory system 2000 can include semiconductor memory device 2100 and controller 2200. Semiconductor memory device 2100 can include a plurality of semiconductor memory chips. The plurality of semiconductor memory chips may be divided into a plurality of groups.

In FIG. 25, it is illustrated that the plurality of groups communicate with controller 2200 through first to kth channels CH1 to CHk. Each of the semiconductor memory chips may be configured and operated in substantially the same manner as semiconductor memory device 100 described above with reference to FIG. 1.

Each group may be configured to communicate with controller 2200 through a single common channel. Controller 2200 may be configured in substantially the same manner as controller 1100 described with reference to FIG. 24, and configured to control the plurality of memory chips of semiconductor memory device 2100 through the plurality of first to kth channels CH1 to CHk.

Figure 26:
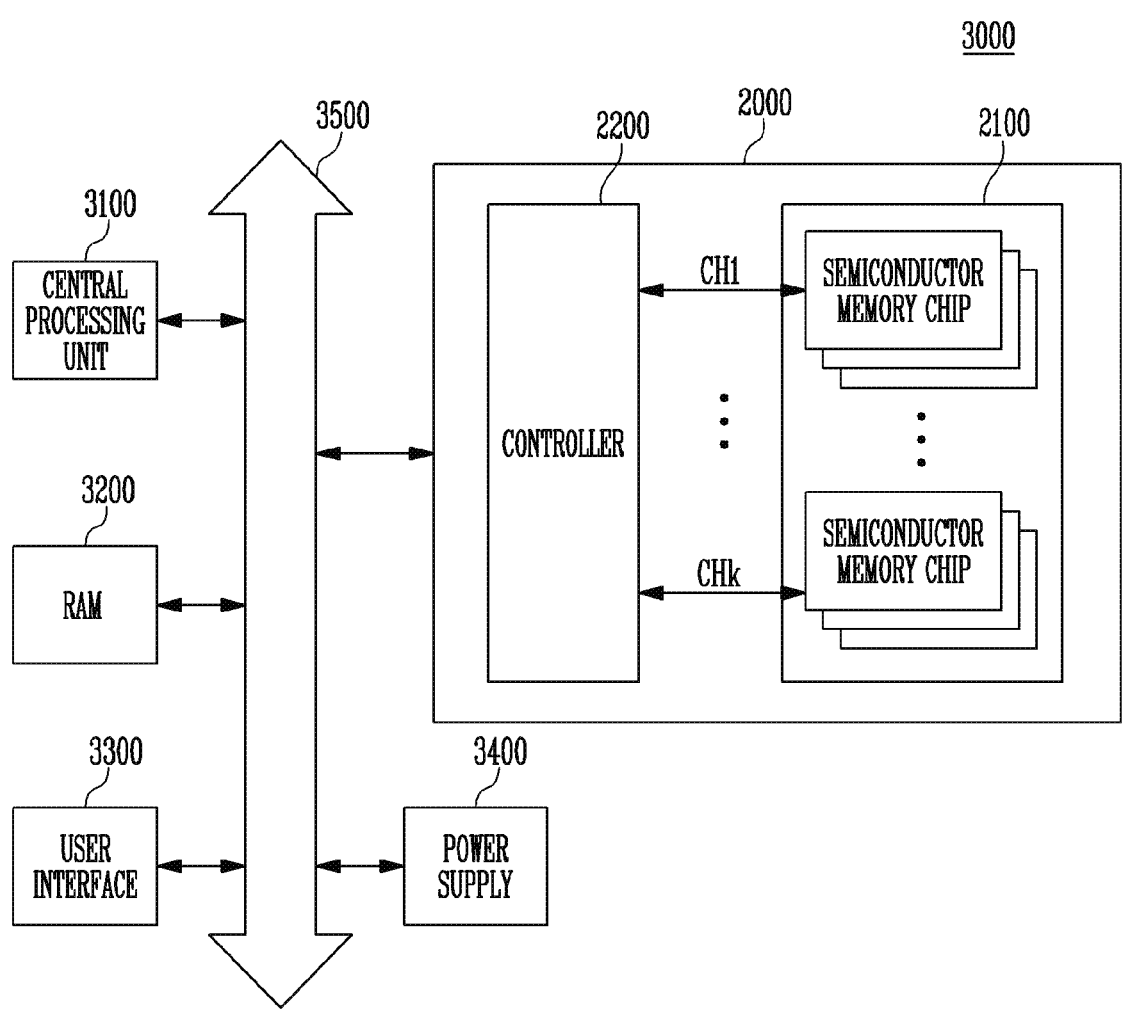
FIG. 26 is a block diagram illustrating a computing system including a memory system described with reference to FIG. 25.

FIG. 26 is a block diagram illustrating computing system 3000 including memory system 2000 described with reference to FIG. 25.

Computing system 3000 may include central processing unit 3100, random access memory (RAM) 3200, user interface 3300, power supply 3400, system bus 3500, and memory system 2000.

Memory system 2000 may be electrically coupled to CPU 3100, RAM 3200, user interface 3300, and power supply 3400 through system bus 3500. Data provided through user interface 3300 or data processed by central processing unit 3100 may be stored in the memory system 2000.

FIG. 26 illustrates that semiconductor memory device 2100 is coupled to system bus 3500 through controller 2200. However, semiconductor memory device 2100 may be directly coupled to the system bus 3500. The functions of controller 2200 may be performed by central processing unit 3100 and RAM 3200.

FIG. 26 illustrates that memory system 2000 described above with reference to FIG. 25 is provided. However, memory system 2000 may be replaced with memory system 1000 described above with reference to FIG. 24. According to an exemplary embodiment, computing system 3000 may include both memory systems 1000 and 2000 described above with reference to FIGS. 24 and 25.

An exemplary embodiment of the present disclosure provides a method of operating a semiconductor memory device having improved reliability.

Another exemplary embodiment of the present disclosure provides a semiconductor memory device having improved reliability.

In the above-discussed exemplary embodiments, all steps may be selectively performed or skipped. In addition, the steps in each exemplary embodiment might not always be performed in regular order. Furthermore, the exemplary embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

While the exemplary embodiments of the present disclosure have been disclosed for illustrative purposes, those skilled in the art will appreciate that various modifications, additions and substitutions are possible. Thus, it is intended that the present invention cover all such modifications provided they come within the scope of the appended claims and their equivalents.

What is claimed is:

1. A method of operating a semiconductor memory device including a plurality of planes, the method comprising:
   applying a program pulse to a selected word line and updating a program pulse count value;
   determining a current sensing mode based upon the program pulse count value;
   performing a program verify operation based upon the current sensing mode; and
   as a result of performing the program verify operation, floating a local word line of a completely programmed plane for all target program states among the plurality of planes,
   wherein the determining of the current sensing mode comprises determining one of an individual state current sensing operation for determining verify pass or fail for one target program state and an all-state current sensing operation for determining verify pass or fail for all target program states.

2. The method of claim 1, wherein the determining of the current sensing mode comprises comparing the program pulse count value with a predetermined critical count value.

3. The method of claim 2, wherein when the program pulse count value is greater than the predetermined critical count value, the performing of the program verify operation comprises performing the all-state current sensing operation.

4. The method of claim 3, wherein the performing of the program verify operation further comprises performing the individual state current sensing operation after the all-state current sensing operation is performed.

5. The method of claim 2, wherein when the program pulse count value is smaller than the critical count value, the performing of the program verify operation comprises performing the individual state current sensing operation.

6. A method of operating a semiconductor memory device including a plurality of planes, the method comprising:
   applying a program pulse to a selected word line and updating a program pulse count value;
   determining a current sensing mode based upon a program progress;
   performing a program verify operation based upon the current sensing mode; and
   as a result of performing the program verify operation, floating a local word line of a completely programmed plane for all target program states among the plurality of planes,
   wherein the determining of the current sensing mode comprises determining one of an individual state current sensing operation for determining verify pass or fail for one target program state and an all-state current sensing operation for determining verify pass or fail for all target program states.

7. The method of claim 6, wherein the determining of the current sensing mode comprises comparing a predetermined critical index value with an index value indicating a target program state for which verification is currently performed.

8. The method of claim 7, wherein the performing of the program verify operation comprises performing the all-state current sensing operation when the index value is greater than the predetermined critical index value.

9. The method of claim 8, wherein the performing of the program verify operation further comprises performing the individual state current sensing operation after the all-state current sensing operation is performed.

10. The method of claim 7, wherein the performing of the program verify operation comprises performing the individual state current sensing operation when the index value is smaller than the predetermined critical index value.

11. A semiconductor memory device, comprising:
   a memory cell array including a plurality of memory cells;
   a current sensing circuit that generates a pass signal or a fail signal based upon a program verify result on selected memory cells, among the plurality of memory cells; and
   a control logic that receives the pass signal or the fail signal and controls an operation of the current sensing circuit,
   wherein the control logic controls the current sensing circuit to perform one of an all-state current sensing operation for determining verify pass or fail for all target program states and an individual state current sensing operation for determining verify pass or fail for one target program state, wherein the memory cell array includes a plurality of planes, and wherein, when a plane, among the plurality of planes, on which a program operation for all target program states is completed, the control logic is configured to float a local word line coupled to the plane.

12. The semiconductor memory device of claim 11, wherein the control logic comprises:

a program pulse counter that counts a number of times a program pulse is applied to a target word line coupled to the selected memory cells during a program operation; and a sensing mode controller that generates a current sensing control signal for determining a sensing mode of the current sensing circuit based upon a program pulse count value counted by the program pulse counter.

13. The semiconductor memory device of claim 12, wherein the sensing mode controller compares the program pulse count value with a predetermined critical count value and generates the current sensing control signal for controlling the current sensing circuit to perform a current sensing operation for one target program state when the program pulse count value is smaller than the predetermined critical count value, and for controlling the current sensing circuit to perform a current sensing operation for all target program states when the program pulse count value is greater than the predetermined critical count value.

14. The semiconductor memory device of claim 11, wherein the control logic comprises:

a program progress storage unit that generates an index value of a target program state for which verification is currently performed during a program operation; and a sensing mode control unit that generates a current sensing control signal for determining a sensing mode of the current sensing circuit based upon the index value.

15. The semiconductor memory device of claim 14, wherein the sensing mode control unit compares the index value with a predetermined critical index value and generates the current sensing control signal for controlling the current sensing circuit to perform a current sensing operation for one target program state when the index value is smaller than the predetermined critical index value, and for controlling the current sensing circuit to perform a current sensing operation for all target program states when the index value is greater than the predetermined critical index value.

* * * * *